(12) United States Patent
Yun et al.

(10) Patent No.: US 11,079,784 B2
(45) Date of Patent: Aug. 3, 2021

(54) POWER MANAGEMENT INTEGRATED CIRCUIT (PMIC), MEMORY MODULE AND COMPUTING SYSTEM INCLUDING A PMIC, AND METHOD OF OPERATING A MEMORY SYSTEM

(71) Applicant: SAMSUNG ELECTRONICS CO., LTD., Suwon-si (KR)

(72) Inventors: Jinseong Yun, Suwon-si (KR); Kyudong Lee, Suwon-si (KR); Jaejun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/801,221

(22) Filed: Feb. 26, 2020

(65) Prior Publication Data

US 2020/0333818 A1    Oct. 22, 2020

(30) Foreign Application Priority Data

Apr. 19, 2019  (KR) .................. 10-2019-0045923
Jul. 18, 2019  (KR) .................. 10-2019-0086958

(51) Int. Cl.
*G11C 5/14*        (2006.01)
*G05F 1/575*       (2006.01)
*G11C 11/4074*     (2006.01)
*G06F 1/28*        (2006.01)
*G11C 11/4076*     (2006.01)
*G11C 11/4093*     (2006.01)

(52) U.S. Cl.
CPC .............. *G05F 1/575* (2013.01); *G06F 1/28* (2013.01); *G11C 11/4074* (2013.01); *G11C 11/4076* (2013.01); *G11C 11/4093* (2013.01)

(58) Field of Classification Search
CPC .. G05F 1/575; G11C 11/4074; G11C 11/4076; G11C 11/4093; G11C 5/147; G11C 29/00; G11C 5/04; G06F 1/28
USPC ........................................................ 365/226
See application file for complete search history.

(56) References Cited

U.S. PATENT DOCUMENTS

| 7,242,170 B1 | 7/2007 | Natsume |
| 8,018,753 B2 | 9/2011 | Carr et al. |
| 2003/0193829 A1* | 10/2003 | Morgan ............ G11C 11/40622 365/222 |
| 2005/0088154 A1 | 4/2005 | Sugiura |

(Continued)

FOREIGN PATENT DOCUMENTS

| JP | 2001-268895 A | 9/2001 |
| JP | 2004-297925A A | 10/2004 |
| JP | 5910033 B2 | 4/2016 |

*Primary Examiner* — Hoai V Ho
*Assistant Examiner* — Minh Dinh
(74) *Attorney, Agent, or Firm* — Volentine, Whitt & Francos, PLLC

(57) ABSTRACT

A power management integrated circuit (PMIC) includes a voltage regulator, a monitoring circuit, and a count register. The voltage regulator is configured to generate an output voltage. The monitoring circuit is configured to receive a feedback voltage of the output voltage, and to determine at each of periodic intervals whether the feedback voltage is outside a threshold voltage range. The count register is configured to store a count value indicative of a number of times the feedback voltage is determined by the monitoring circuit to be outside the threshold voltage range.

19 Claims, 19 Drawing Sheets

(56) References Cited

U.S. PATENT DOCUMENTS

| | | | |
|---|---|---|---|
| 2016/0357665 A1* | 12/2016 | Lee | G06F 3/0653 |
| 2017/0068263 A1 | 3/2017 | Shankar et al. | |
| 2019/0064916 A1* | 2/2019 | Jouin | G06F 1/3293 |
| 2019/0107856 A1* | 4/2019 | Lim | G05F 1/575 |
| 2020/0201408 A1* | 6/2020 | Lehwalder | G05B 23/0235 |
| 2020/0243119 A1* | 7/2020 | Spica | G06F 11/3037 |

* cited by examiner

POWER MANAGEMENT INTEGRATED CIRCUIT (PMIC), MEMORY MODULE AND COMPUTING SYSTEM INCLUDING A PMIC, AND METHOD OF OPERATING A MEMORY SYSTEM

BACKGROUND

Embodiments of the inventive concept described herein relate to a power management integrated circuit (PMIC), to a memory module and computing system including a PMIC, and to a method of operating a memory system including a PMIC.

Power management integrated circuits (PMICs) are primarily utilized to supply and distribute appropriate power supply voltages to the various semiconductor devices contained in a system. In particular, the PMIC may regulate a level of a power supply voltage and/or the amount of current to be supplied to a given semiconductor device within the system. However, the power integrity (PI) of a power supply voltage supplied by the PMIC can be adversely impacted due to a number of factors including operating environment, operational status, workload, operating frequency and the like.

SUMMARY

According to an aspect of the inventive concepts, a power management integrated circuit (PMIC) is provided that includes a voltage regulator, a monitoring circuit, and a count register. The voltage regulator is configured to generate an output voltage. The monitoring circuit is configured to receive a feedback voltage of the output voltage, and to determine at each of periodic intervals whether the feedback voltage is outside a threshold voltage range. The count register is configured to store a count value indicative of a number of times the feedback voltage is determined by the monitoring circuit to be outside the threshold voltage range.

According to another aspect of the inventive concepts, a dynamic access memory (DRAM) module that includes a DRAM device and a power management integrated circuit (PMIC) configured to supply an operating voltage to the DRAM device. The PMIC includes a voltage regulator, a monitoring circuit, a count register and an interface (I/F). The voltage regulator is configured to output the operating voltage to the DRAM device. The monitoring circuit is configured to receive a feedback voltage of the operating voltage, and to determine at each of periodic intervals whether the feedback voltage is outside a threshold voltage range. The count register is configured to store a count value indicative of a number of times the feedback voltage is determined by the monitoring circuit to be outside the threshold voltage range. The I/F is configured to output monitoring data corresponding to the count value stored in the register externally of the DRAM module.

According to still another aspect of the inventive concepts, a dynamic random access memory (DRAM) module is provided that includes a module board, a DRAM device mounted to the module board, and a power management integrated circuit (PMIC) mounted to the module board. The DRAM device includes a plurality of operating voltage terminals, and the PMIC is configured to generate a plurality of operating voltages applied to the respective plurality of operating voltage terminals of the DRAM, and to receive a plurality of feedback voltages of the respective plurality of operating voltages. The PMIC includes a monitoring circuit configured to determine a number of times each of the plurality of feedback voltages is outside a respective threshold voltage range, and to store the number of times in a count register.

According to yet another aspect of the inventive concepts, a computing system is provided that includes a host device and a plurality of memory modules. The plurality of memory modules each include a memory device and a power management integrated circuit (PMIC) including a voltage regulator configured to supply an operating voltage to the memory device, the PMIC outputting monitoring data to the host device indicative of a number of voltage range violations of the operating voltage at each of a plurality of periodic intervals. The host device is configured to maintain a power integrity of each memory module based on the monitoring data output by the PMIC.

According to another aspect of the inventive concepts, a computing system is provided that includes a host device, a plurality of first memory modules, and a plurality of second memory module. The host device includes a processor and first and second memory controllers operatively connected to the processor. The plurality of first memory modules are operatively connected to the first memory controller over a first channel, each of the first memory modules including a plurality of first memory devices and a first power management integrated circuit (PMIC) operatively connected to the first channel and to the plurality of first memory modules. The plurality of second memory modules are operatively connected to the second memory controller over a second channel, each of the second memory modules including a plurality of second memory devices and a second PMIC operatively connected to the second channel and to the plurality of second memory modules. The first PMIC of each first memory module includes a first voltage regulator configured to supply first operating voltages to the first memory devices, and a first monitoring circuit configured to count a number of voltage range violations of the first operating voltages at periodic intervals and to output monitoring data indicative of the number of voltage range violations over the first channel to the host device. The second PMIC of each second memory module includes a second voltage regulator configured to supply second operating voltages to the second memory devices, and a second monitoring circuit configured to count a number of voltage range violations of the second operating voltages at period intervals and to output monitoring data indicative of the number of voltage range violations over the second channel to the host device.

According to another aspect of the inventive concepts, a method of operating a memory system is provided. The memory system includes a host device and a memory module, the memory module including a memory device and a power management integrated circuit (PMIC). The method includes supplying an operating voltage from the PMIC to the memory device, transmitting a read/write command from the host to the memory device, and processing the read/write command to output read data from the memory device to the host or to write data from the host to the memory device. The method further includes monitoring, by the PMIC and during the processing of the read/write command, a feedback voltage of the operating voltage to determine at each of periodic intervals whether the feedback voltage is outside a threshold voltage range. The method further includes transmitting monitoring data from the PMIC to the host denoting a count value, the count value corresponding to a number of times the feedback voltage was determined to be outside the threshold voltage range.

DETAILED DESCRIPTION

Figure 1A:
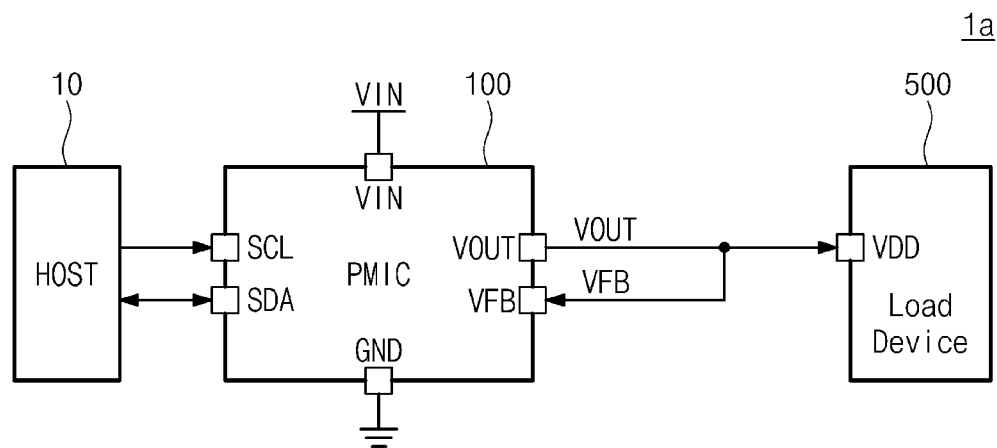
FIGS. 1A and 1B illustrate block diagrams of computing systems according to embodiments of the inventive concept.
Figure 1B:
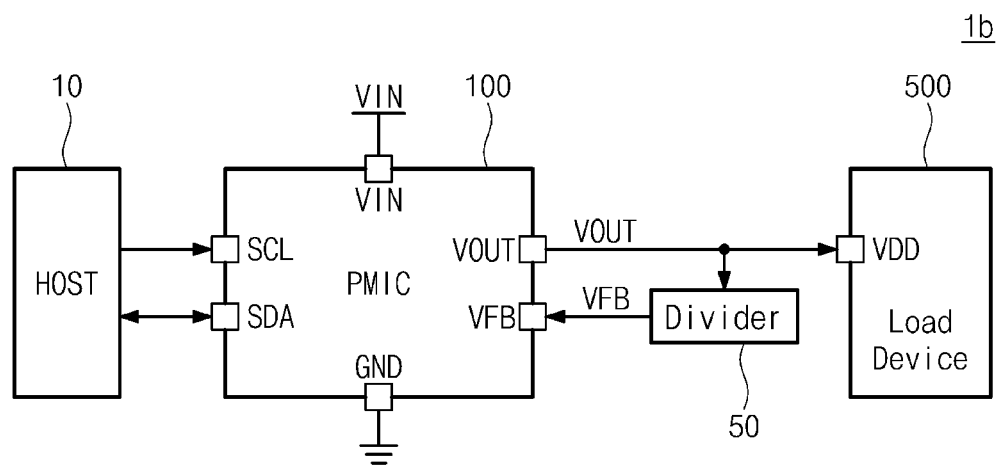

FIGS. 1A and 1B illustrate block diagrams of computing systems 1a and 1b, respectively according to embodiments of the inventive concept. The computing systems 1a and 1b may be also referred to as "electronic systems", "memory systems", "communication systems", "test systems", and so on. The computing systems 1a and 1b may be implemented in an electronic device, a desktop computer, a laptop computer, a server, a workstation, a mobile device, and so on.

Referring to FIGS. 1A and 1B, the computing systems 1a and 1b may include a host 10, a power management integrated circuit (PMIC) 100, and a load device 500. In comparison with the computing system 1a, a computing system 1b may further include a voltage divider 50.

The host 10 is a master device that may communicate with the PMIC 100. For example, the host 10 may drive a serial clock line SCL and a serial data line SDA between the host 10 and the PMIC 100 in compliance with a given communication protocol, such as a serial peripheral interface (SPI) protocol, an inter-integrated circuit (I2C) protocol, or an I3C protocol. The host 10 may transmit an SCL signal (clock signal) to the PMIC 100 through the SCL and may transmit an SDA signal (data signal) synchronized with the SCL signal to the PMIC 100 through the SDA.

The host 10 may initiate communication by driving the SCL to a first logical state (e.g., logic high) and driving the SDA from the first logical state to a second logical state (e.g., logic low). The host 10 may transmit the SDA signal including address bits of the PMIC 100 and an R/W bit indicating a read operation or a write operation, to the PMIC 100. As will be explained in more detail later, the host 10 may write setting information to the PMIC 100, and may read count information from the PMIC 100. The host 10 may receive the SDA signal including an acknowledge (ACK) bit from the PMIC 100. The host 10 may check (or determine) whether the address bits and the R/W bit are successfully transmitted to the PMIC 100, by using the ACK bit.

When the R/W bit indicates the write operation, the host 10 may transmit the SDA signal including bits of write data to the PMIC 100. The host 10 may receive, from the PMIC 100, the SDA signal including the ACK bit indicating whether the write data are successfully transmitted. When the R/W bit indicates the read operation, the host 10 may receive the SDA signal including bits of read data from the PMIC 100. The host 10 may transmit, to the PMIC 100, the SDA signal including the ACK bit indicating that the read data are successfully received. The host 10 may initiate the end of communication by driving the SCL to the first logical state and driving the SDA from the second logical state to the first logical state. However, the communication protocol between the host 10 and the PMIC 100 is not limited to the above description or example.

The PMIC 100 is a slave device that may communicate with the host 10. The PMIC 100 may include an SCL pin terminal that is connected to the SCL and receives the SCL signal and an SDA pin terminal that is connected to the SDA and receives the SDA signal or outputs the SDA signal. The PMIC 100 may further include a VIN pin terminal receiving an input voltage VIN, a GND pin terminal receiving a ground voltage GND, a VOUT pin terminal outputting an output voltage VOUT, and a VFB pin terminal receiving a feedback voltage VFB. The PMIC 100 may generate the output voltage VOUT based on the input voltage VIN and may supply the output voltage VOUT to the load device 500. The input voltage VIN may be a power supply voltage of the PMIC 100. The PMIC 100 may receive the feedback voltage VFB that is based on the output voltage VOUT. Unlike the example illustrated in FIGS. 1A and 1B, the host 10 may be the load device 500. In this case, the PMIC 100 may supply the output voltage VOUT to the host 10.

The feedback voltage VFB is feedback voltage of the output voltage VOUT. That is, the feedback voltage VFB may be a voltage corresponding to the output voltage that is fed back to the PMIC 100 after the output voltage VOUT is supplied to the load device 500. Referring to FIG. 1A, the output voltage VOUT may be directly provided to the PMIC 100, and a level of the feedback voltage VFB may be the same as a level of the output voltage VOUT. On the other hand, referring to FIG. 1B, the output voltage VOUT may be indirectly provided to the PMIC 100. For example, the output voltage VOUT may be provided to the PMIC 100 through a voltage divider 50 or a filter circuit including passive elements (e.g., a resistor, a capacitor, an inductor, and so on). In this case, the voltage divider 50 or the filter circuit may be placed on a substrate on which the PMIC 100 and the load device 500 are mounted. In this case, the level of the feedback voltage VFB may be different from the level of the output voltage VOUT. In any case, based on the feedback voltage VFB, the PMIC 100 may monitor the output voltage VOUT, may regulate the level of the output voltage VOUT, or may determine whether to continue to supply the output voltage VOUT.

The load device 500 may operate based on the output voltage VOUT supplied from the PMIC 100. The output voltage VOUT may be a power supply voltage of the load device 500. The load device 500 may be any electronic device that is supplied with a power supply voltage. For example, the load device 500 may be a semiconductor device or an electronic device, such as the host 10, a processor, a memory controller, a memory module, a memory device, a storage device, and so on.

When the load device 500 performs an operation accompanying various workloads, the PMIC 100 may provide a numerical basis for examining or evaluating the power integrity (PI) of the output voltage VOUT and managing and improving the PI. In addition, a user may directly set a reference for monitoring the output voltage VOUT in the PMIC 100 through the host 10. That is, the PMIC 100 may monitor the output voltage VOUT depending on setting information that is set by a request of the user.

Figure 2:
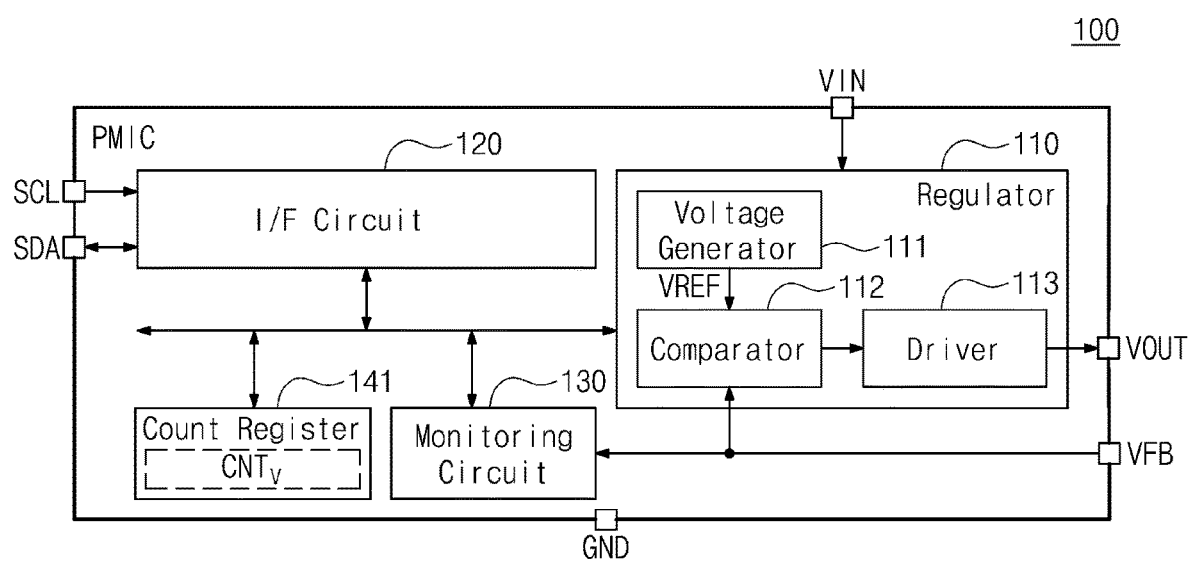
FIG. 2 illustrates a block diagram of a PMIC of FIGS. 1A and 1B according to embodiments of the inventive concept.

FIG. 2 illustrates a block diagram of a PMIC of FIGS. 1A and 1B according to an embodiment of the inventive concept. The PMIC 100 may include a regulator 110, an interface circuit 120, a monitoring circuit 130, and a count register 141. All of the PMIC 100 and the components 110, 120, 130, and 141 may be implemented in hardware.

The regulator 110 may generate the output voltage VOUT based on the input voltage VIN and may regulate a level of the output voltage VOUT to a target level. The target level may be determined as specified by the load device 500 that is supplied with the output voltage VOUT from the PMIC 100. As examples, the regulator 110 may be a low-dropout (LDO) regulator, a buck regulator, a boost regulator, and so on. The regulator 110 may include a voltage generator 111, a comparator 112, and a driver 113.

The voltage generator 111 may generate a reference voltage VREF having a reference level corresponding to the target level of the output voltage VOUT. When the output voltage VOUT is directly provided to the PMIC 100, the level of the feedback voltage VFB may be the same as the level of the output voltage VOUT, and the level of the reference voltage VREF may be the same as the target level. When the output voltage VOUT is not directly provided to the PMIC 100 but is provided to the PMIC 100 through a voltage divider or a filter circuit as described previously, the level of the feedback voltage VFB may be different from the level of the output voltage VOUT, and the level of the reference voltage VREF may be different from the target level. Separately, as an example, the voltage generator 111 may include a bandgap reference (BGR) circuit.

The comparator 112 may compare the feedback voltage VFB with the reference voltage VREF. The comparator 112 may determine whether the level of the feedback voltage VFB is higher (greater) or lower (less) than the level of the reference voltage VREF. For example, the comparator 112 may include an operational amplifier that amplifies a voltage level difference between the feedback voltage VFB and the reference voltage VREF.

The driver 113 may drive the output voltage VOUT based on a comparison result of the comparator 112 and the input voltage VIN. When the level of the feedback voltage VFB is lower than the reference level, the driver 113 may increase (raise) the level of the output voltage VOUT; when the level of the feedback voltage VFB is higher than the reference level, the driver 113 may decrease (lower) the level of the output voltage VOUT. The driver 113 may include switch elements (e.g., power transistors) and passive elements.

The interface circuit 120 may receive the SCL signal and the SDA signal through the SCL pin terminal and the SDA pin terminal, respectively. The interface circuit 120 may receive an address, write data, a command, the ACK bit, and so on. from the host 10 based on the SCL signal and the SDA signal. The interface circuit 120 may transmit read data, the ACK bit, and so on. to the host 10 based on the SCL signal and the SDA signal. The interface circuit 120 may include a command decoder that decodes a command of the host 10. The command decoder may control any other components of the PMIC 100 based on the command of the host 10.

The monitoring circuit 130 may monitor the feedback voltage VFB that corresponds to the output voltage VOUT again fed back to the PMIC 100 after the output voltage VOUT is output from the PMIC 100. The monitoring circuit 130 may monitor whether the feedback voltage VFB based on the output voltage VOUT is out of a reference voltage range, at monitoring intervals during a monitoring time. The monitoring interval is shorter than the monitoring time. The monitoring circuit 130 may store the number of times (hereinafter referred to as a "violation count") $CNT_V$ that the feedback voltage VFB is out of the reference voltage range. The reference voltage range may be determined depending on a tolerance of the output voltage VOUT that the user requires. The reference voltage range may be narrower than a protection range of the output voltage VOUT, in which the PMIC 100 protects the load device 500. The count register 141 may store a monitoring result (e.g., the violation count $CNT_V$) of the monitoring circuit 130. The count register 141 may be implemented by using a static random access memory (SRAM), a flip-flop, a latch, and so on. The violation count $CNT_V$ may be an index in which a level of the PI of the output voltage VOUT to be managed is quantified. The interface circuit 120 may transmit the violation count $CNT_V$ stored in the count register 141 to the host 10 or an external device.

Figure 3:
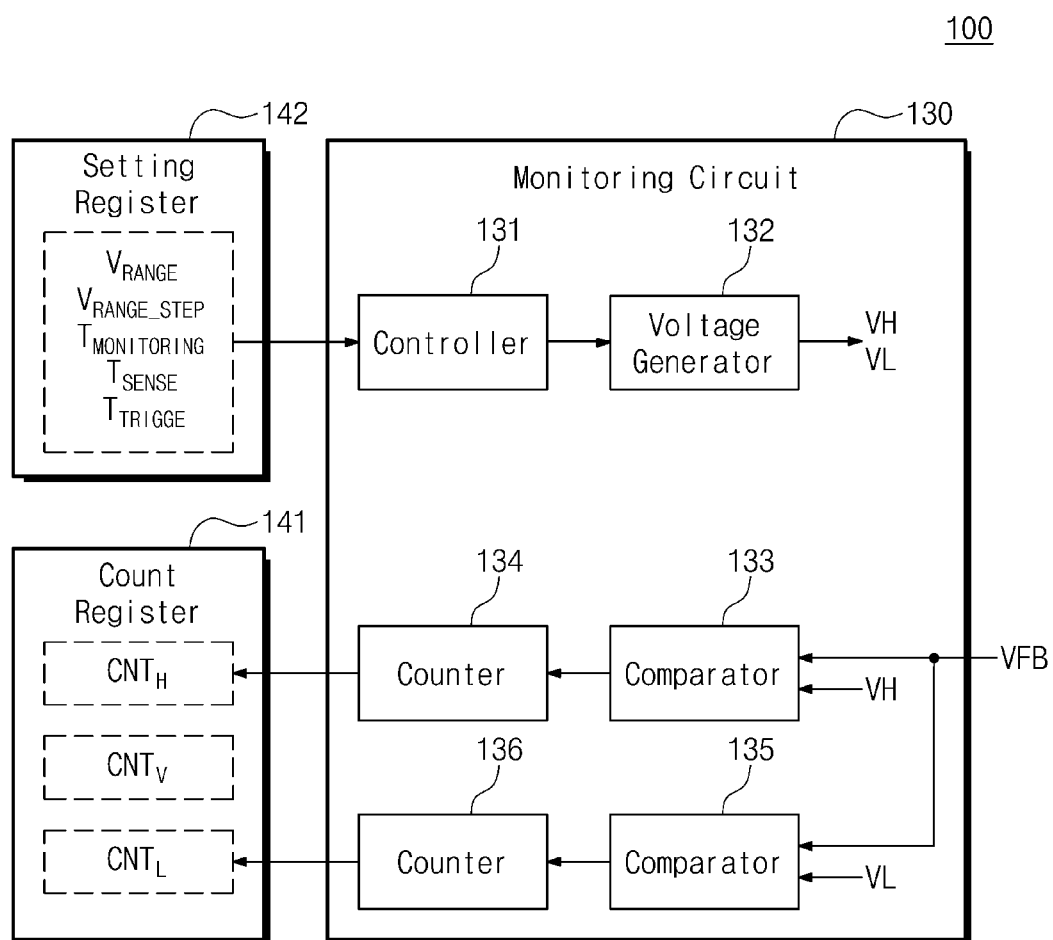
FIG. 3 illustrates a monitoring circuit and a register of a PMIC of FIG. 2 according to embodiments of the inventive concept.

FIG. 3 illustrates a monitoring circuit and a register of a PMIC of FIG. 2 in detail. The remaining components of the PMIC 100 other than the monitoring circuit 130 and the count register 141 are not illustrated. The PMIC 100 may further include a setting register 142. The monitoring circuit 130 may include a controller 131, a voltage generator 132, a comparator 133, a counter 134, a comparator 135, and a counter 136.

The controller 131 may read the setting information stored in the setting register 142. The setting information may include operational parameters for controlling an operation of monitoring the output voltage VOUT. The operational parameters may include at least one of the threshold voltage range, a duration of each of the periodic intervals, a monitoring time during which the monitoring circuit is operative, a deviation from a target feedback voltage which defines the threshold voltage range, a monitoring start trigger to start monitoring by the monitoring circuit, and a monitoring stop trigger to stop monitoring by the monitoring circuit. The host 10 may transmit the setting information to the PMIC 100. The setting register 142 may store the setting information transmitted from the host 10.

For example, referring to the specific examples shown in setting register of FIG. 3, the controller 131 may control the voltage generator 132 based on the value of the reference voltage range $V_{RANGE}$ and the value of the resolution $V_{RANGE\_STEP}$. The voltage generator 132 may generate reference voltages VH and VL under control of the controller 131. The one voltage generator 132 may generate all the reference voltages VH and VL as illustrated in FIG. 3, or two voltage generators 132 may generate the reference voltages VH and VL, respectively. For example, the voltage generator 132 may include a digital to analog converter (DAC). A voltage difference between the reference voltages VH and VL may correspond of the reference voltage range $V_{RANGE}$. The reference voltage range $V_{RANGE}$ may be a percentage of the level of the feedback voltage VFB corresponding to the target level of the output voltage VOUT. The value of the resolution $V_{RANGE\_STEP}$ may be a step by which the reference voltage range $V_{RANGE}$ is regulated (adjusted). Each of a unit of the value of the reference voltage range $V_{RANGE}$ and a unit of the value of the resolution $V_{RANGE\_STEP}$ may be a percentage of the level of the feedback voltage VFB corresponding to the target level of the output voltage VOUT. The host 10 may change (or adjust) the value of the reference voltage range $V_{RANGE}$ depending on the value of the resolution $V_{RANGE\_STEP}$ to change the reference voltage range $V_{RANGE}$.

The controller 131 may control the comparators 133 and 135, based on the value of the monitoring time $T_{MONITORING}$, the value of the monitoring interval $T_{SENSE}$, and the triggering bit $T_{TRIGGER}$. The controller 131 may start, initiate, or trigger a monitoring operation with reference to the triggering bit $T_{TRIGGER}$. For example, when the host 10 sets the triggering bit $T_{TRIGGER}$ to a first logical value, the controller 131 may start the monitoring operation. When the host 10 sets the triggering bit $T_{TRIGGER}$ to a second logical value, the controller 131 may terminate the monitoring operation.

At each monitoring interval $T_{SENSE}$ during the monitoring time $T_{MONITORING}$, the controller 131 may activate (or enable) the comparators 133 and 135 and then may deactivate (or disable) the activated (or enabled) comparators 133 and 135. Whenever a time corresponding to the monitoring interval $T_{SENSE}$ elapses, the controller 131 may activate the comparators 133 and 135 and then may deactivate the activated comparators 133 and 135. The comparator 133 may compare the feedback voltage VFB with the reference voltage VH at the monitoring intervals $T_{SENSE}$ during the monitoring time $T_{MONITORING}$. The comparator 135 may compare the feedback voltage VFB with the reference voltage VL at the monitoring intervals $T_{SENSE}$ during the monitoring time $T_{MONITORING}$. Operations of the comparators 133 and 135 may be similar to the operation of the comparator 112 except that the reference voltages VH and VL are received instead of the reference voltage VREF. When the triggering bit $T_{TRIGGER}$ is set to the first logical value and the monitoring time $T_{MONITORING}$ elapses, the controller 131 may not activate the comparators 133 and 135 any longer.

The counter 134 may count the number of times (hereinafter referred to as a "ripple count") $CNT_H$ that the feedback voltage VFB exceeds the reference voltage VH (or equals to or is greater than the reference voltage VH), based on a comparison result of the comparator 133. The counter 136 may count the number of times (hereinafter referred to as a "ripple count") $CNT_L$ that the feedback voltage VFB is less than the reference voltage VL (or equals to or is less than the reference voltage VL) based on a comparison result of the comparator 135. For example, the counters 134 and 136 may be implemented by using flip-flops.

The count register 141 may store the ripple count $CNT_H$. That the ripple count $CNT_H$ becomes greater means that the event that the level of the feedback voltage VFB is higher than the level of the reference voltage VH during the monitoring time occurs relatively frequently. The count register 141 may store the ripple count $CNT_L$. That the ripple count $CNT_L$ becomes greater means that the event that the level of the feedback voltage VFB is lower than the level of the reference voltage VL during the monitoring time occurs relatively frequently. The count register 141 may store the violation count $CNT_V$ being a sum of the ripple count $CNT_H$ and the ripple count $CNT_L$. The controller 131 may calculate the violation count $CNT_V$. That the violation count $CNT_V$ becomes greater means that a ripple of the output voltage VOUT is relatively great and the PI of the output voltage VOUT becomes relatively worse.

The count register 141 and the setting register 142 may constitute a register set. The PMIC 100 may include the register set. The register set may further include an address register that stores an address of the PMIC 100 being a slave device.

Figure 4:
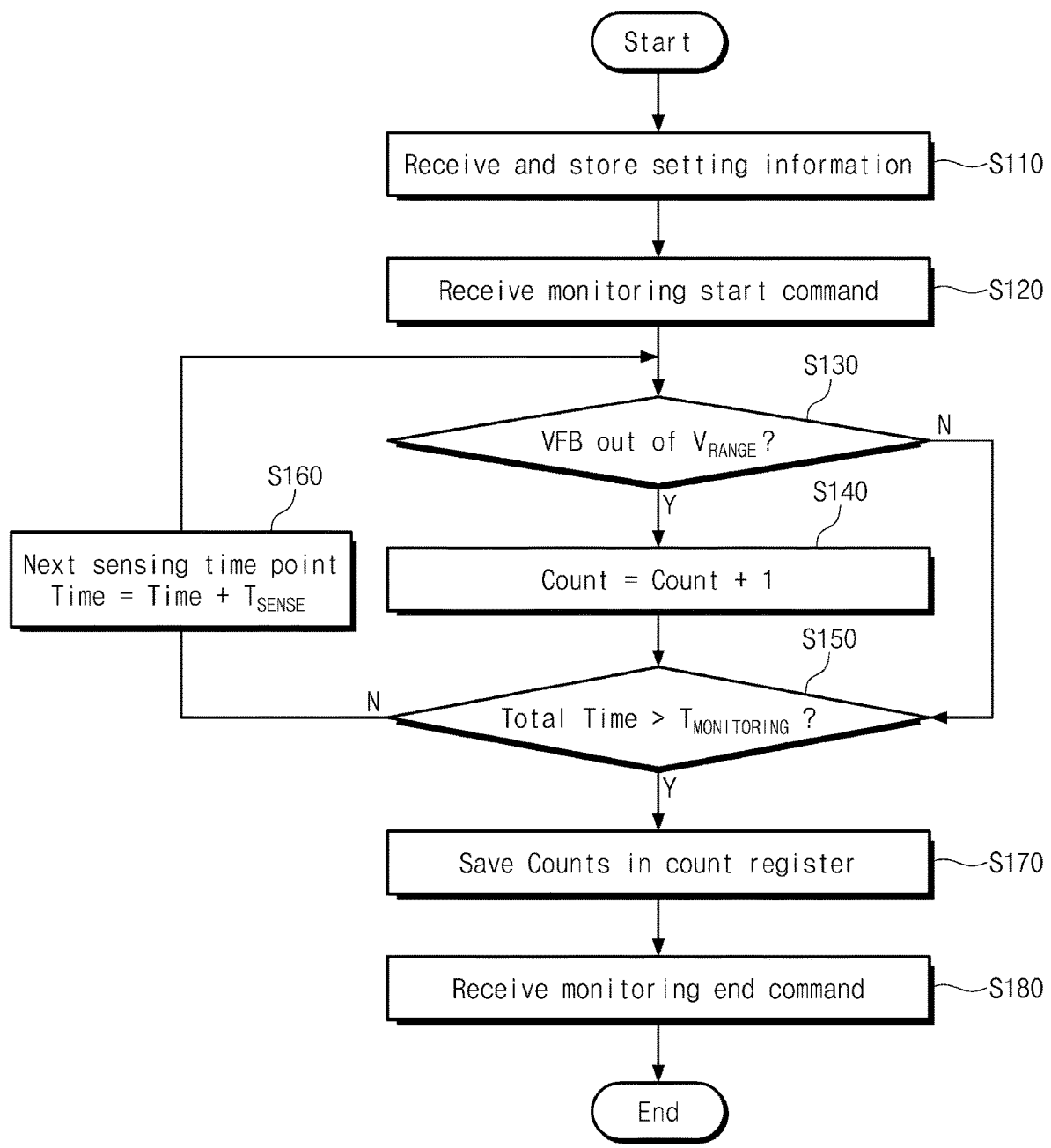
FIG. 4 illustrates a flowchart of an operating method of a PMIC of FIGS. 1A and 1B according to embodiments of the inventive concept.

FIG. 4 illustrates a flowchart of an operating method of a PMIC of FIGS. 1A and 1B. In operation S110, the interface circuit 120 may receive setting information from the host 10. The setting register 142 may store the setting information. For example, the host 10 may change a monitoring condition of the output voltage VOUT by updating the setting information stored in the setting register 142 depending on a request of the user. The host 10 may adjust the reference voltage range $V_{RANGE}$ by changing a value of the reference voltage range $V_{RANGE}$ depending on a value of the resolution $V_{RANGE\_STEP}$. The host 10 may adjust the monitoring time $T_{MONITORING}$ by adjusting a value of the monitoring time $T_{MONITORING}$. The host 10 may adjust the monitoring interval $T_{SENSE}$ by adjusting a value of the monitoring interval $T_{SENSE}$.

In operation S120, the interface circuit 120 may receive a monitoring start command from the host 10. The monitoring circuit 130 may start a monitoring operation in response to the monitoring start command. For example, the host 10 may set the triggering bit $T_{TRIGGER}$ of the setting register 142 to the first logical value by transmitting the monitoring start command to the PMIC 100. The monitoring circuit 130 may read the triggering bit $T_{TRIGGER}$ and may start the monitoring operation of the output voltage VOUT.

In operation S130, the comparators 133 and 135 of the monitoring circuit 130 may monitor whether the feedback voltage VFB is out of the reference voltage range $V_{RANGE}$. When the feedback voltage VFB is out of the reference voltage range $V_{RANGE}$, in operation S140, the counter 134 may increase the ripple count $CNT_H$ as much as "1", or the counter 136 may increase the ripple count $CNT_L$ as much as "1". When the feedback voltage VFB is within the reference voltage range $V_{RANGE}$, the process proceeds to operation S150 without increasing the ripple counts $CNT_H$ and $CNT_L$.

In operation S150, the controller 131 may determine whether the monitoring time $T_{MONITORING}$ elapses from a time point when the monitoring start command is received. When the monitoring time $T_{MONITORING}$ does not elapse, in operation S160, the controller 131 of the monitoring circuit 130 may again activate the comparators 133 and 135 at a sensing time point determined by the monitoring interval $T_{SENSE}$, and the process proceeds to operation S130. Operation S130 to operation S160 may be repeated until the monitoring time $T_{MONITORING}$ elapses. The monitoring circuit 130 may monitor whether the feedback voltage VFB based on the output voltage VOUT is out of the reference voltage range $V_{RANGE}$, at the monitoring intervals $T_{SENSE}$ during the monitoring time $T_{MONITORING}$ based on the setting information.

When the monitoring time $T_{MONITORING}$ elapses, in operation S170, the counters 134 and 136 may store the ripple counts $CNT_H$ and $CNT_L$ in the count register 141. The controller 131 may store the violation count $CNT_V$ being a sum of the ripple count $CNT_H$ and the ripple count $CNT_L$ in the count register 141. In operation S180, the interface circuit 120 may receive a monitoring end command from the host 10. For example, the host 10 may set the triggering bit $T_{TRIGGER}$ of the setting register 142 to the second logical value by transmitting the monitoring end command to the PMIC 100. The interface circuit 120 may transmit at least one of the ripple count $CNT_L$, the ripple count $CNT_H$, and the violation count $CNT_V$ to the host 10 in response to the monitoring end command.

Figure 5:
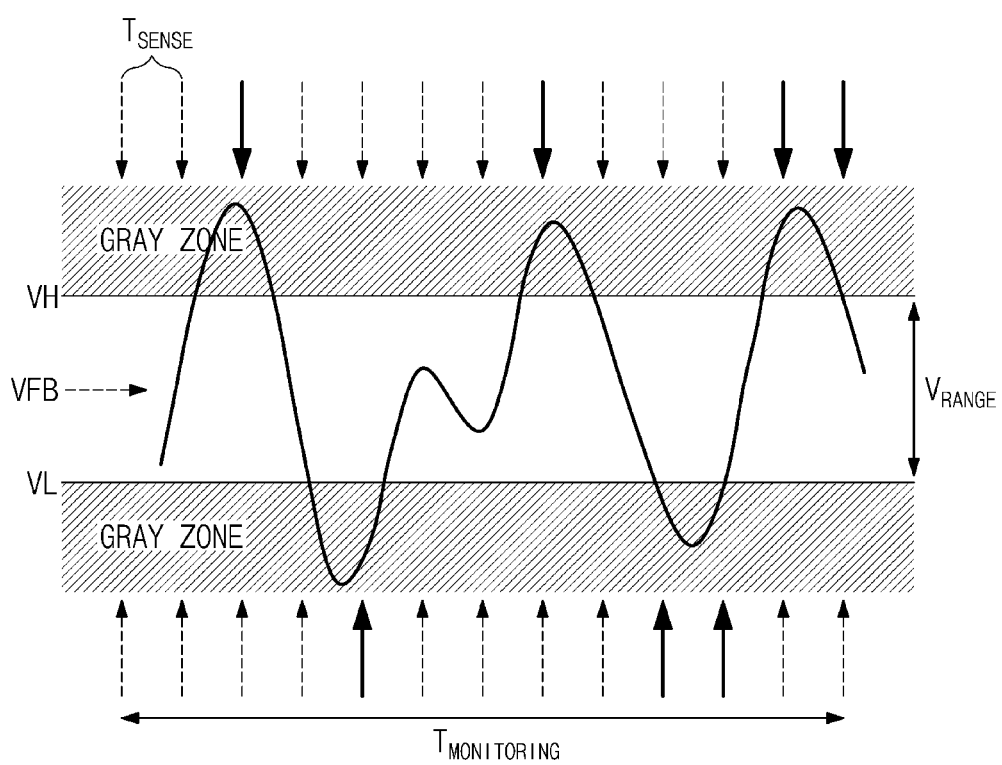
FIG. 5 illustrates a flowchart in which a PMIC of FIGS. 1A and 1B monitors a feedback voltage according to embodiments of the inventive concept.

FIG. 5 illustrates a flowchart in which a PMIC of FIGS. 1A and 1B monitors a feedback voltage. In FIG. 5, a horizontal axis represents a time, and a vertical axis represents a voltage level. An interval between sensing time points that arrows indicate may be the monitoring interval $T_{SENSE}$. At each sensing time point, the comparator 133 may compare the feedback voltage VFB with the reference voltage VH, and the comparator 135 may compare the feedback voltage VFB with the reference voltage VL. For example, the feedback voltage VFB may be within the reference voltage range $V_{RANGE}$ at sensing time points that dotted-line arrows indicate, and the feedback voltage VFB may be in a gray zone being out of the reference voltage range $V_{RANGE}$ at sensing time points that solid-line arrows indicate. $V_{RANGE}$ is bounded by an upper threshold voltage VH and a lower threshold voltage VL which deviate a given percentage from a target voltage. For VH and VL may between plus-and-minus 2% to 6% the target voltage (see Table 1 below). An example is illustrated in FIG. 5 as the monitoring intervals $T_{SENSE}$ are constant (i.e., of the same duration) during the monitoring time $T_{MONITORING}$, but the inventive concept is not limited thereto. For example, the monitoring intervals $T_{SENSE}$ may be different during the monitoring time $T_{MONITORING}$. Table 1 below shows an example of a monitoring condition of the feedback voltage VFB according to setting information stored in the setting register 142. Values in Table 1 are exemplary, and the inventive concept is not limited to the values in Table 1.

TABLE 1

| Setting Information | | MIN | TYP | MAX | UNIT |
|---|---|---|---|---|---|
| $V_{RANGE}$ | Uncounted Range | ±2 | | ±6 | % |
| $V_{RANGE\_STEP}$ | $V_{RANGE}$ resolution | | 1 | | % |
| $CNT_H$ | High side Vripple count | 0 | | 255 | ea |
| $CNT_L$ | Low side Vripple count | 0 | | 255 | ea |
| $T_{TRIGGER}$ | Start to monitor | When $T_{TRIGGER}$ is set to '1', then PMIC start to monitor feedback voltage | | | |
| $T_{SENSE}$ | Ripple Sensing Gap | TBD | 500n | 800n | sec |
| $T_{MONITORING}$ | Monitoring time | 128u | 256u | 1024u | sec |

Figure 6:
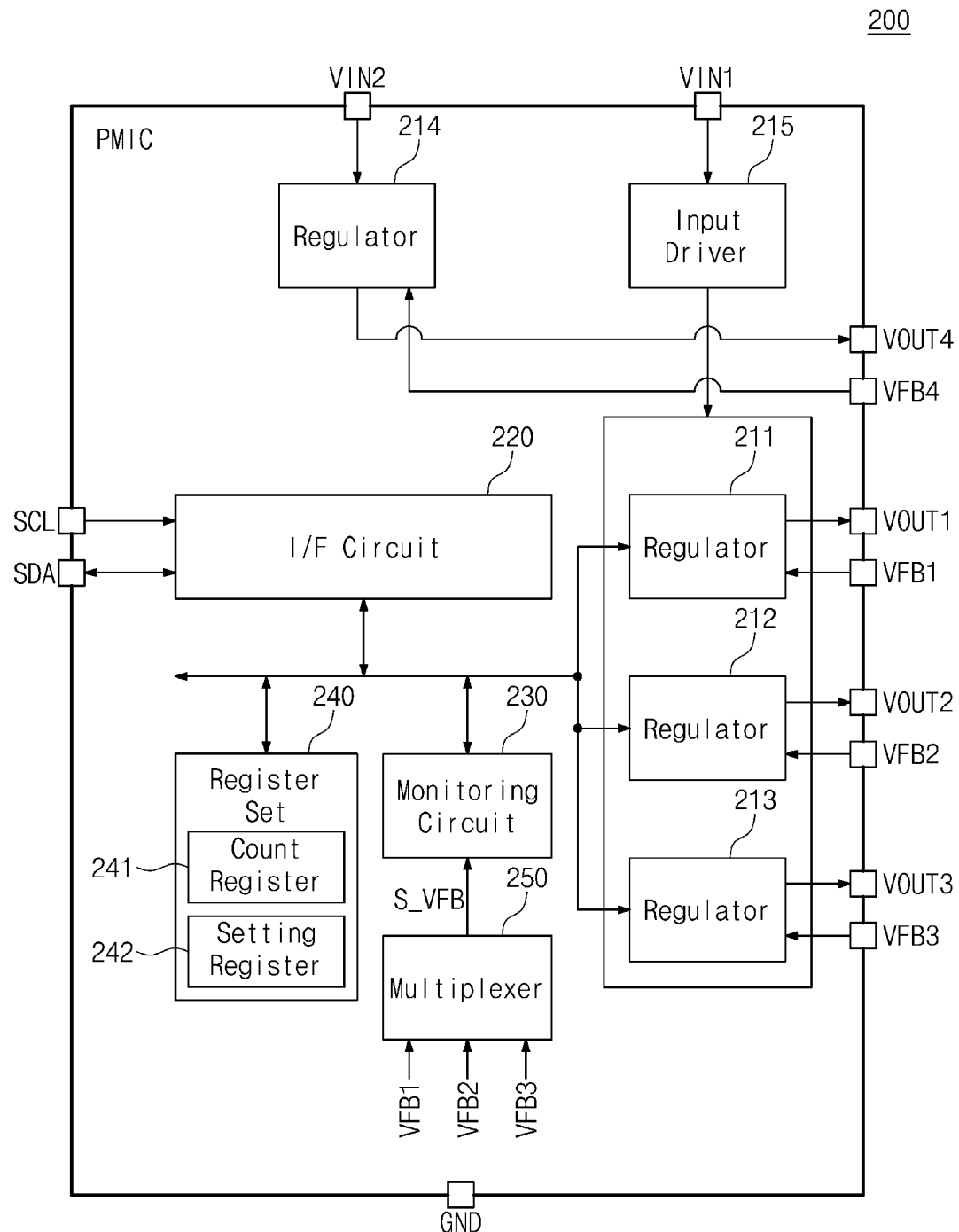
FIG. 6 illustrates a block diagram of a PMIC according to another embodiment of the inventive concept.

FIG. 6 illustrates a block diagram of a PMIC according to another embodiment of the inventive concept. A PMIC 200 may include regulators 211 to 214, an input driver 215, an interface circuit 220, a monitoring circuit 230, a register set 240, and a multiplexer 250. A description will be focused on a difference between the PMIC 200 and the PMIC 100. The regulators 211 to 214 may respectively generate output voltages VOUT1 to VOUT4 and may respectively regulate the output voltages VOUT1 to VOUT4 to target levels. An operation of each of the regulators 211 to 214 may be similar to the operation of the regulator 110. The regulators 211 to 213 may be supplied with an input voltage VIN1 and may generate the output voltages VOUT1 to VOUT3 by using the input voltage VIN1, respectively. The regulator 214 may be supplied with an input voltage VIN2 lower in level than the input voltage VIN1 and may generate the output voltage VOUT4 by using the input voltage VIN2. For example, each of the regulators 211 to 213 may be a buck regulator, and the regulator 214 may be an LDO regulator. The output voltages VOUT1 to VOUT3 may be supplied to a load device consuming a relatively great power. The output voltage VOUT4 may be supplied to a load device consuming a relatively small power. The input driver 215 may supply the input voltage VIN1 to the regulators 211 to 213. Unlike the example illustrated in FIG. 6, the input voltage VIN1 may be directly supplied to the regulators 211 to 213 without the input driver 215.

A configuration and an operation of the interface circuit 220 may be substantially the same as the configuration and the operation of the interface circuit 120. The register set 240 may include a count register 241 corresponding to the count register 141 and a setting register 242 corresponding to the setting register 142. Unlike the monitoring circuit 130, the monitoring circuit 230 may receive a feedback voltage S_VFB selected from feedback voltages VFB1 to VFB3. The monitoring circuit 230 may monitor the selected feedback voltage S_VFB (operation S120 to operation S170 of FIG. 4). A configuration and an operation of the monitoring circuit 230 may be substantially the same as the configuration and the operation of the monitoring circuit 130.

The multiplexer 250 may select one of the feedback voltages VFB1 to VFB3 and may provide the selected feedback voltage S_VFB to the monitoring circuit 230. For example, the multiplexer 250 may select a feedback voltage, which corresponds to an output voltage targeted for a monitoring operation depending on a request of the host 10, from among the feedback voltages VFB1 to VFB3. The monitoring start command transmitted from the host 10 may request the monitoring operation with regard to one of the output voltages VOUT1 to VOUT3.

Figure 7:
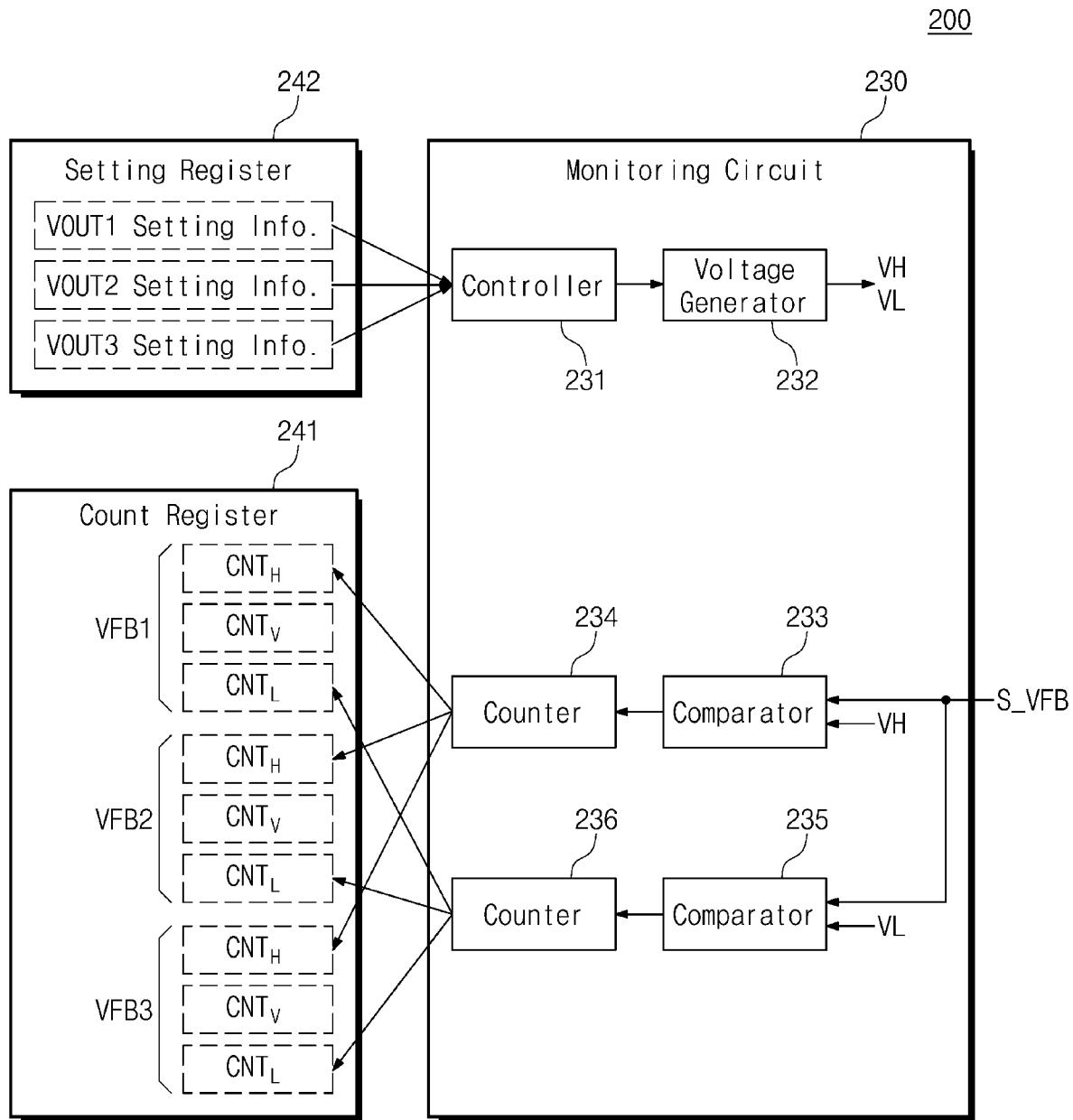
FIG. 7 illustrates a monitoring circuit and a register of a PMIC of FIG. 6 according to embodiments of the inventive concept.

FIG. 7 illustrates a monitoring circuit and a register of a PMIC of FIG. 6 in detail. The monitoring circuit 230 may include a controller 231, a voltage generator 232, a comparator 233, a counter 234, a comparator 235, and a counter 236.

The setting register 242 may store setting information including monitoring conditions of the output voltage VOUT1, setting information including monitoring conditions of the output voltage VOUT2, and setting information including monitoring conditions of the output voltage VOUT3. As in the setting information stored in the setting register 142, each of the setting information of the output voltage VOUT1, the setting information of the output voltage VOUT2, and the setting information of the output voltage VOUT3 may include a value of the reference voltage range $V_{RANGE}$, a value of the resolution $V_{RANGE\_STEP}$ of the reference voltage range $V_{RANGE}$, a value of the monitoring time $T_{MONITORING}$, a value of the monitoring interval $T_{SENSE}$, and the triggering bit $T_{TRIGGER}$ with regard to each of the feedback voltages VFB1 to VFB3. The host 10 may transmit the setting information of the output voltage VOUT1, the setting information of the output voltage VOUT2, and the setting information of the output voltage VOUT3 to the PMIC 200.

The controller 231 may read setting information corresponding to an output voltage targeted for the monitoring operation depending on a request of the host 10 and may control the voltage generator 232, the comparators 233 and 235, and the counters 234 and 236 as in the controller 131. For example, the host 10 may transmit the monitoring start command for requesting monitoring the output voltage VOUT1 of the output voltages VOUT1 to VOUT3 to the PMIC 200 (refer to operation S120). The host 10 may set the triggering bit $T_{TRIGGER}$ of the setting information of the output voltage VOUT1 to the first logical value. The multiplexer 250 may select the feedback voltage VFB1 and may provide the feedback voltage VFB1 as the selected feedback voltage S_VFB, to the monitoring circuit 230.

The controller 231 may read the setting information of the output voltage VOUT1 and may control the voltage generator 232, the comparators 233 and 235, and the counters 234 and 236. The voltage generator 232 may generate the reference voltages VH and VL indicating the reference voltage range $V_{RANGE}$ associated with the feedback voltage VFB1. The comparator 233 may compare the feedback voltage VFB1 with the reference voltage VH. The comparator 235 may compare the feedback voltage VFB1 with the reference voltage VL. The counter 234 may count the ripple count $CNT_H$ indicating the number of times that the feedback voltage VFB1 exceeds the reference voltage VH (or equals to or is greater than the reference voltage VH), based on a comparison result of the comparator 233 and may store the ripple count $CNT_H$ in the count register 241. The counter 236 may count the ripple count $CNT_L$ indicating the number of times that the feedback voltage VFB1 is less than the reference voltage VL (or equals to or is less than the reference voltage VL), based on a comparison result of the comparator 235 and may store the ripple count $CNT_L$ in the count register 241. The controller 231 may store the violation count $CNT_V$ of the feedback voltage VFB, which corresponds to a sum of the ripple count $CNT_H$ and the ripple count $CNT_L$, in the count register 241.

When the host 10 requests the monitoring operation with regard to the output voltage VOUT2 or VOUT3, the monitoring circuit 230 may monitor the output voltage VOUT2 or the output voltage VOUT3 to be similar to the way to monitor the output voltage VOUT1. Operations of the components 231 to 236 of the monitoring circuit 230 may be similar to the operations of the components 131 to 136 of the monitoring circuit 130.

Figure 8:
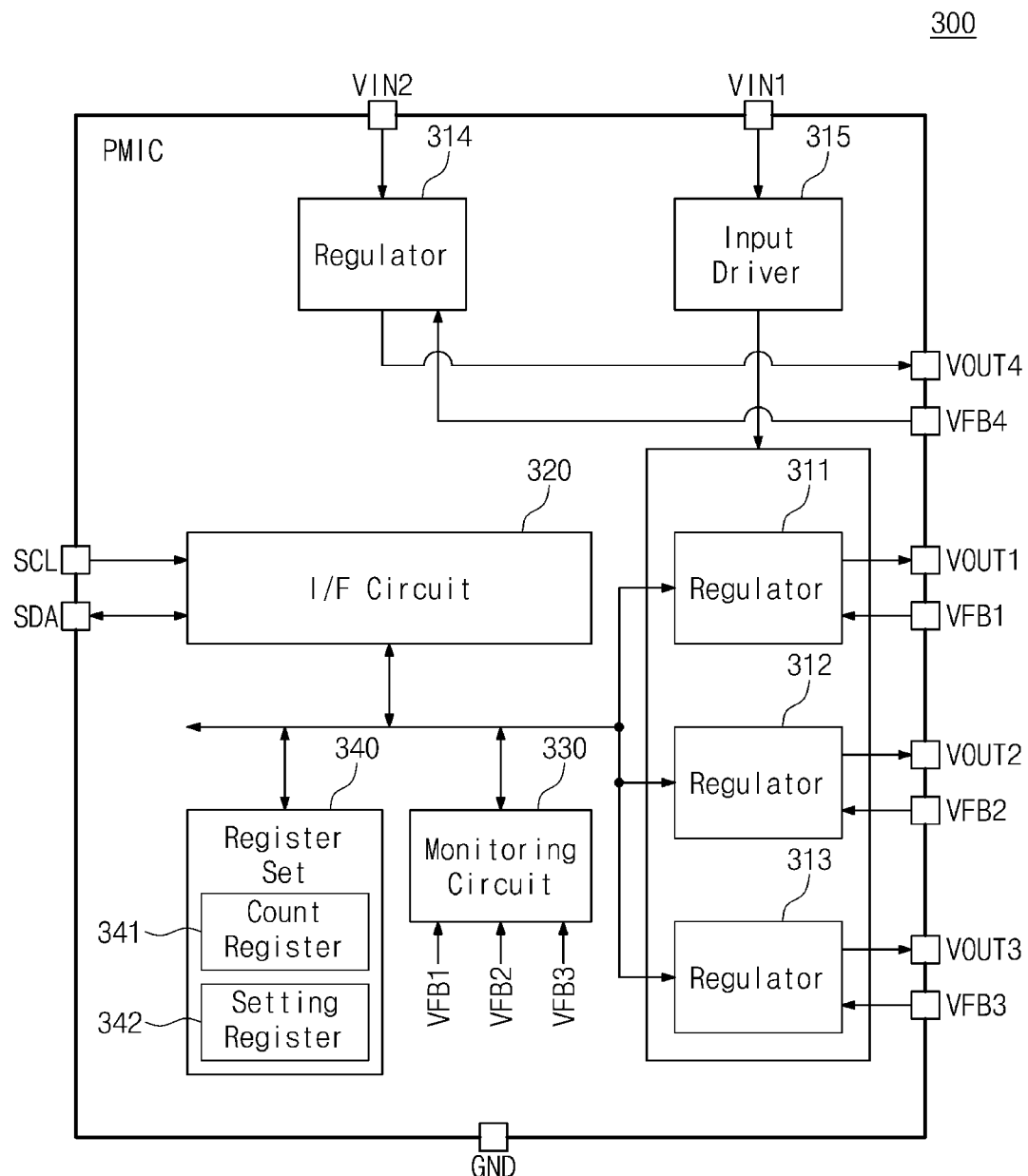
FIG. 8 illustrates a block diagram of a PMIC according to another embodiment of the inventive concept.

FIG. 8 illustrates a block diagram of a PMIC according to another embodiment of the inventive concept. A PMIC 300 may include regulators 311 to 314, an input driver 315, an interface circuit 320, a monitoring circuit 330, and a register set 340. The components 311 to 314, 315, 320, and 340 of the PMIC 300 may be substantially the same as the components 211 to 214, 215, 220, and 240 of the PMIC 200. The PMIC 300 may not include the multiplexer 250 of the PMIC 200. The monitoring circuit 230 may perform a monitoring operation on the feedback voltage S_VFB selected from the feedback voltages VFB1 to VFB3, however, the monitoring circuit 330 may perform monitoring operations on the feedback voltages VFB1 to VFB3 in parallel or at the same time.

Figure 9:
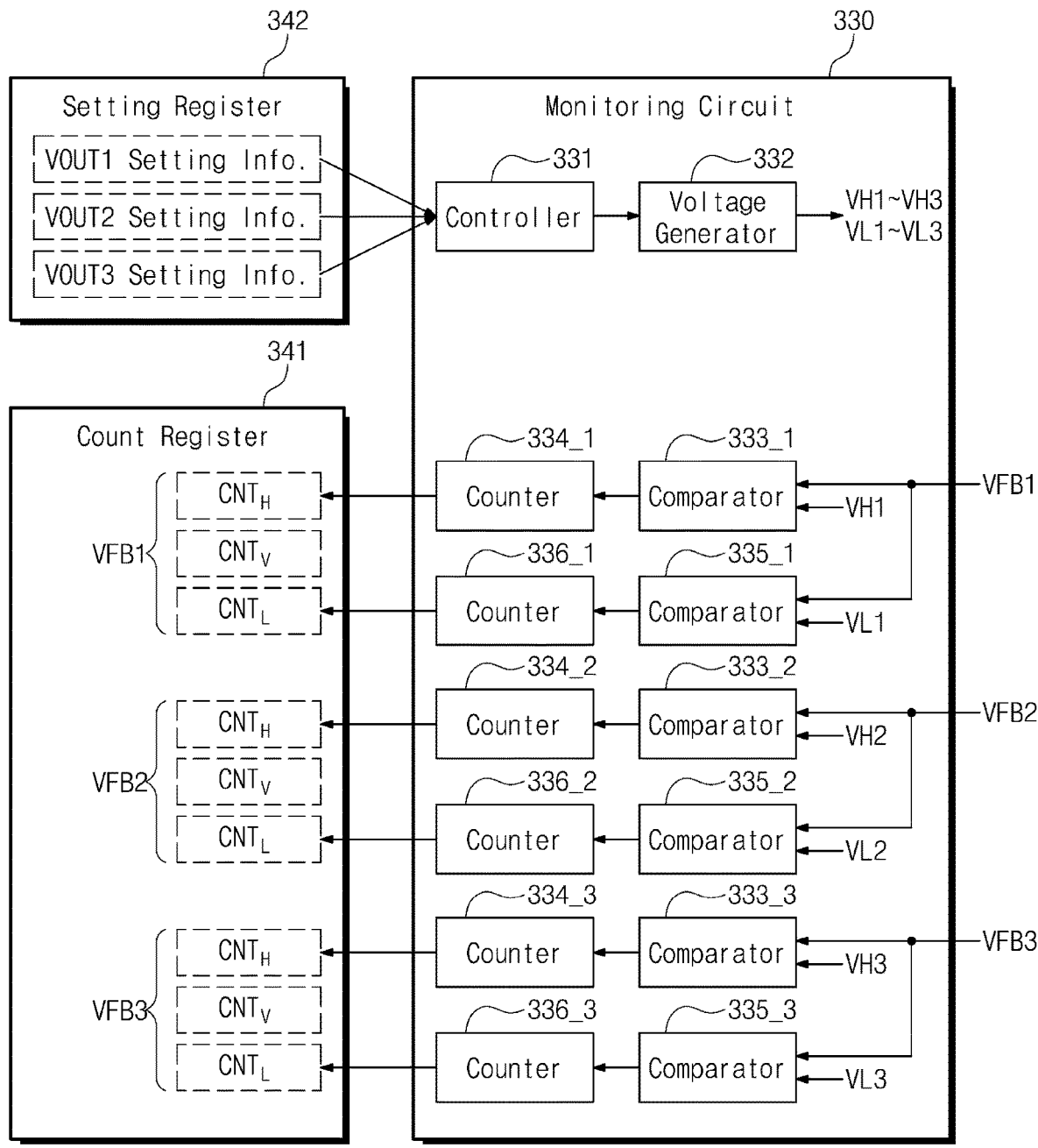
FIG. 9 illustrates a monitoring circuit and a register of a PMIC of FIG. 8 according to embodiments of the inventive concept.

FIG. 9 illustrates a monitoring circuit and a register of a PMIC of FIG. 8 in detail. The monitoring circuit 330 may include a controller 331. As in the controller 231, the controller 331 may read the setting information of the output voltage VOUT1, the setting information of the output voltage VOUT2, and the setting information of the output voltage VOUT3 stored in a setting register 342 and may control the components 332, 333_1 to 333_3, 334_1 to 334_3, 335_1 to 335_3, and 336_1 to 336_3 of the monitoring circuit 330.

The monitoring circuit 330 may further include a voltage generator 332. Under control of the controller 331, the voltage generator 332 may generate reference voltages VH1 and VL1 indicating the reference voltage range $V_{RANGE}$ for the feedback voltage VFB1, reference voltages VH2 and VL2 indicating the reference voltage range $V_{RANGE}$ for the feedback voltage VFB2, and reference voltages VH3 and VL3 indicating the reference voltage range $V_{RANGE}$ for the feedback voltage VFB3. The monitoring circuit 330 may further include a comparator 333_1, a counter 334_1, a comparator 335_1, and a counter 336_1 for monitoring the feedback voltage VFB1. Operations of the above components 333_1 to 336_1 may be substantially the same as the operations of the components 133 to 136 of the monitoring circuit 130. The monitoring circuit 330 may further include a comparator 333_2, a counter 334_2, a comparator 335_2, and a counter 336_2 for monitoring the feedback voltage VFB2. Operations of the above components 333_2 to 336_2 may be substantially the same as the operations of the components 133 to 136 of the monitoring circuit 130. The monitoring circuit 330 may further include a comparator 333_3, a counter 334_3, a comparator 335_3, and a counter 336_3 for monitoring the feedback voltage VFB3. Operations of the above components 333_3 to 336_3 may be substantially the same as the operations of the components 133 to 136 of the monitoring circuit 130.

As in the setting register 242, the setting register 342 may store the setting information including the monitoring conditions of the output voltage VOUT1, the setting information including the monitoring conditions of the output voltage VOUT2, and the setting information including the monitoring conditions of the output voltage VOUT3. As in the count register 241, a count register 341 may store counts $CNT_H$, $CNT_L$, and $CNT_V$ indicating that the feedback voltage VFB1 is out of a reference voltage range, counts $CNT_H$, $CNT_L$, and $CNT_V$ indicating that the feedback voltage VFB2 is out of a reference voltage range, and counts $CNT_H$, $CNT_L$, and $CNT_V$ indicating that the feedback voltage VFB3 is out of a reference voltage range.

Figure 10:
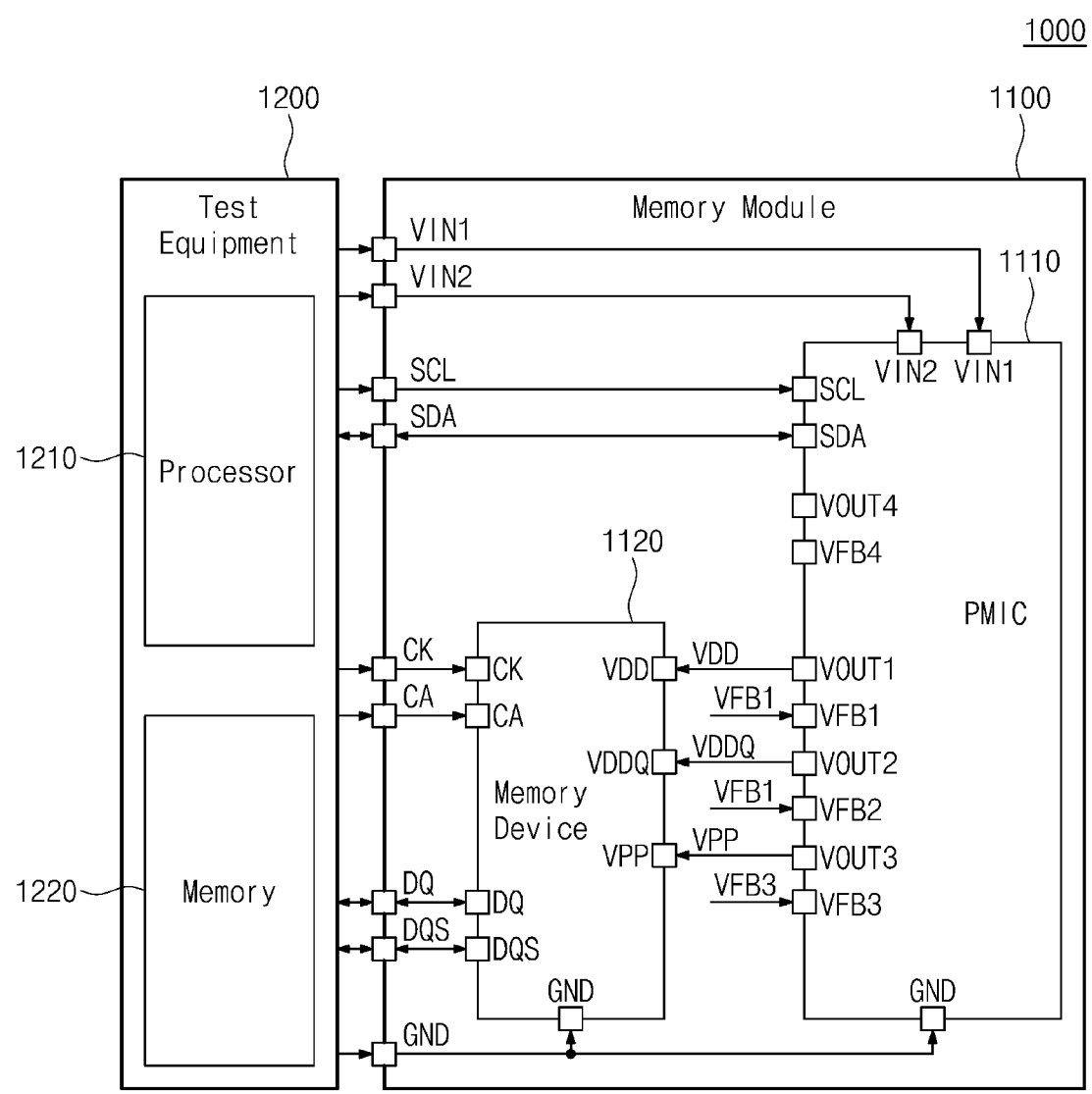
FIG. 10 illustrates a block diagram of a test system according to an embodiment of the inventive concept.

FIG. 10 illustrates a block diagram of a test system according to an embodiment of the inventive concept. A test system 1000 may include a memory module 1100 and test equipment 1200. The memory module 1100 may be a dual in-line memory module (DIMM), a registered DIMM (RDIMM), a load reduced DIMM (LRDIMM), an unbuffered DIMM (UDIMM), a fully buffered DIMM (FB-DIMM), a small outline DIMM (SO-DIMM), or any other memory module (e.g., a single in-line memory module (SIMM)), which complies with the joint electron device engineering council (JEDEC) standard.

The memory module 1100 may include a VIN1 pin terminal receiving the input voltage VIN1, a VIN2 pin terminal receiving the input voltage VIN2, and a GND pin terminal receiving the ground voltage GND. The input voltages VIN1 and VIN2 and the ground voltage GND may be power supply voltages that are supplied to the memory module 1100. The memory module 1100 may further include an SCL pin terminal that is connected to the SCL and receives the SCL signal and an SDA pin terminal that is connected to the SDA and receives the SDA signal or outputs the SDA signal.

The memory module 1100 may further include a CK pin terminal receiving a clock signal CK, a CA pin terminal receiving a command and address signal CA, a DQ pin terminal receiving or transmitting a data input/output signal DQ, and a DQS pin terminal receiving or transmitting a data strobe signal DQS. The clock signal CK, the command and address signal CA, the data input/output signal DQ, and the data strobe signal DQS may be signals associated with a memory device 1120. The command and address signal CA may include one or more signals and may be used to provide a command or an address of the memory device 1120. The data input/output signal DQ may include one or more signals and may be used to provide write data or read data. For ease of illustration, one CK pin terminal, one CA pin terminal, one DQ pin terminal, and one DQS pin terminal are illustrated, but the number of pin terminals for each signal may be one or more.

The memory module 1100 may include a PMIC 1110. The PMIC 1110 may be one of the PMICs 100, 200, and 300 described with reference to FIGS. 1A to 9. Output voltages that are output from VOUT1, VOUT2, and VOUT3 pin terminals of the PMIC 1110 may be power supply voltages VDD (a first supply voltage), VDDQ (a second supply voltage), and VPP (a boosted supply voltage) of the memory device 1120 and may be supplied to the memory device 1120. For example, the PMIC 1110 may be supplied with the input voltage VIN1 of 12 V and the input voltage VIN2 of 3.3 V and may supply the power supply voltage VDD of 1.1 V, the power supply voltage VDDQ of 1.1 V, and the power supply voltage VPP of 1.8 V to the memory device 1120. However, the inventive concept is not limited to the above numerical values.

The memory module 1100 may include the memory device 1120. The memory device 1120 may be referred to as a "memory chip" and may include one or more memory devices. The memory device 1120 may be supplied with the power supply voltage GND through the GND pin terminal of the memory module 1100. The memory device 1120 is not supplied with the power supply voltages VDD, VDDQ, and VPP directly through any pin terminals of the memory module 1100. Instead, the memory device 1120 is supplied with the power supply voltages VDD, VDDQ, and VPP from the PMIC 1110 mounted on the memory module 1100. The memory device 1120 may include a VDD pin terminal, a VDDQ pin terminal, a VPP pin terminal, and a GND pin terminal receiving the power supply voltages VDD, VDDQ, VPP, and GND, respectively. The memory device 1120 may further include a CK pin terminal receiving the clock signal CK, a CA pin terminal receiving the command and address signal CA, a DQ pin receiving or transmitting the data input/output signal DQ, and a DQS pin terminal receiving or transmitting the data strobe signal DQS. For ease of illustration, one CK pin terminal, one CMD pin terminal, one ADD pin terminal, one DQ pin terminal, and one DQS pin terminal are illustrated, but the number of pin terminals for each signal may be one or more.

The memory device 1120 may be various DRAM devices such as a double data rate synchronous dynamic random access memory (DDR SDRAM), DDR2 SDRAM, DDR3 SDRAM, DDR4 SDRAM, DDR5 SDRAM, DDR6 SDRAM, a low power double data rate (LPDDR) SDRAM, LPDDR2 SDRAM, LPDDR3 SDRAM, LPDDR4 SDRAM, LPDDR4X SDRAM, LPDDR5 SDRAM, LPDDR6 SDRAM, a graphics double data rate synchronous graphics random access memory (GDDR SGRAM), GDDR3 SGRAM, GDDR4 SGRAM, GDDR5 SGRAM, GDDR6 SGRAM, and GDDR7 SGRAM. The memory device 1120 may be a memory device, in which semiconductor dies are stacked, such as a high bandwidth memory (HBM), HBM2, or HBM3. The memory device 1120 may include a static random access memory (SRAM) device, a thyristor RAM (TRAM) device, a NAND flash memory device, a NOR flash memory device, a resistive RAM (RRAM), a ferroelectric RAM (FRAM), a phase change RAM (PRAM), a magnetic RAM (MRAM), and so on. A kind of the memory device 1120 is not limited to the above kinds, and the memory device 1120 may include any device capable of storing data.

The test equipment 1200 may test the memory module 1100. The test equipment 1200 may include a processor 1210 and a memory 1220. For example, the test equipment 1200 may be automatic test equipment (ATE). The processor 1210 may generate a test pattern and may store the test pattern in the memory 1220. The test pattern may include memory commands for the memory device 1120. For example, the memory commands may include an active command, a write command, a read command, a precharge command, a refresh command, and so on. The processor 1210 may execute the test pattern for testing the memory module 1100. The memory 1220 may store the test pattern, write data to be stored in the memory module 1100, which are generated as the test pattern is executed, and read data read from the memory module 1100. The test equipment 1200 may supply the power supply voltages VIN1, VIN2, and GND to the memory module 1100. The test equipment 1200 may transmit the SCL signal, the SDA signal, the clock signal CK, and the command and address signal CA to the memory module 1100. The test equipment 1200 may exchange the data input/output signal DQ and the data strobe signal DQS with the memory module 1100.

Figure 11:
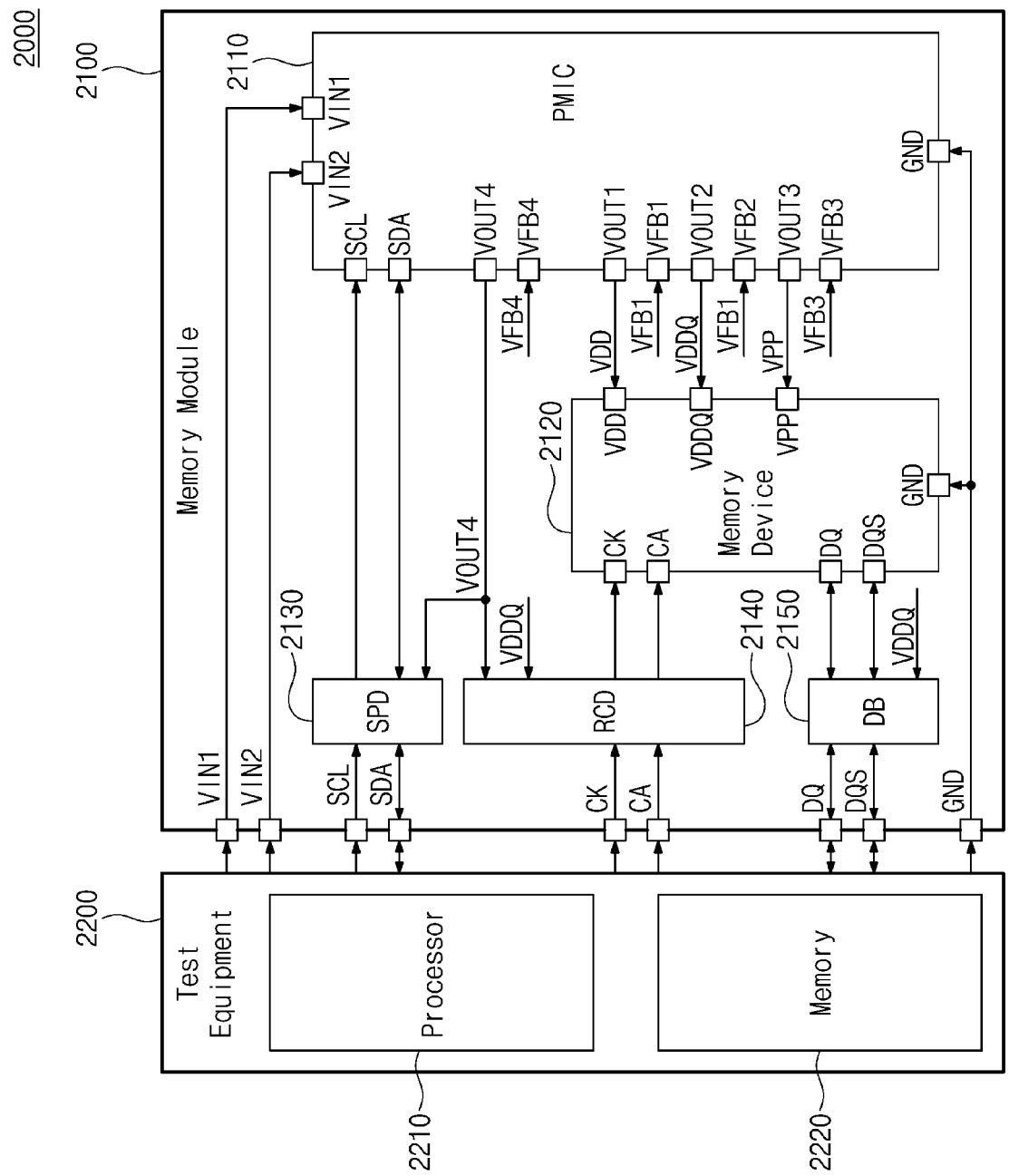
FIG. 11 illustrates a block diagram of a test system according to another embodiment of the inventive concept.

FIG. 11 illustrates a block diagram of a test system according to another embodiment of the inventive concept. A test system 2000 may include a memory module 2100 and test equipment 2200. The test system 2000 may be substantially the same as the test system 1000. The test equipment 2200 may be substantially the same as the test equipment 1200. A description will be focused on a difference between the memory module 2100 and the memory module 1100.

The memory module 2100 may include a PMIC 2110, a memory device 2120, a serial presence detect (SPD) module 2130, a register clock driver (RCD) 2140, and a data buffer (DB) 2150. The PMIC 2110 may be substantially the same as the PMIC 1110. The memory device 2120 may be substantially the same as the memory device 1120.

The SPD module 2130 may include an electrically erasable and programmable read only memory (EEPROM) that stores information of the memory module 2100. The SPD module 2130 may receive the SCL signal and the SDA signal and may transmit the SCL signal and the SDA signal to the PMIC 2110. The SPD module 2130 may be supplied with the power supply voltage VOUT4 from the PMIC 2110. The RCD 2140 may receive the clock signal CK and the command and address signal CA and may transmit the clock signal CK and the command and address signal CA to the memory device 2120. The RCD 2140 may buffer the clock signal CK and the command and address signal CA. The RCD 2140 may transmit, to the memory device 2120, a command and an address associated with the memory device 2120. The RCD 2140 may be supplied with the power supply voltages VDDQ and VOUT4 from the PMIC 2110.

The DB 2150 may receive the data input/output signal DQ including write data and the data strobe signal DQS from the test equipment 2200 and may transmit the data input/output signal DQ including the write data and the data strobe signal DQS to the memory device 2120. The DB 2150 may receive the data input/output signal DQ including read data and the data strobe signal DQS from the memory device 2120 may transmit the data input/output signal DQ including the read data and the data strobe signal DQS to the test equipment 2200. The DB 2150 may buffer the data input/output signal DQ and the data strobe signal DQS. The DB 2150 may be supplied with the power supply voltage VDDQ from the PMIC 2110.

Figure 12:
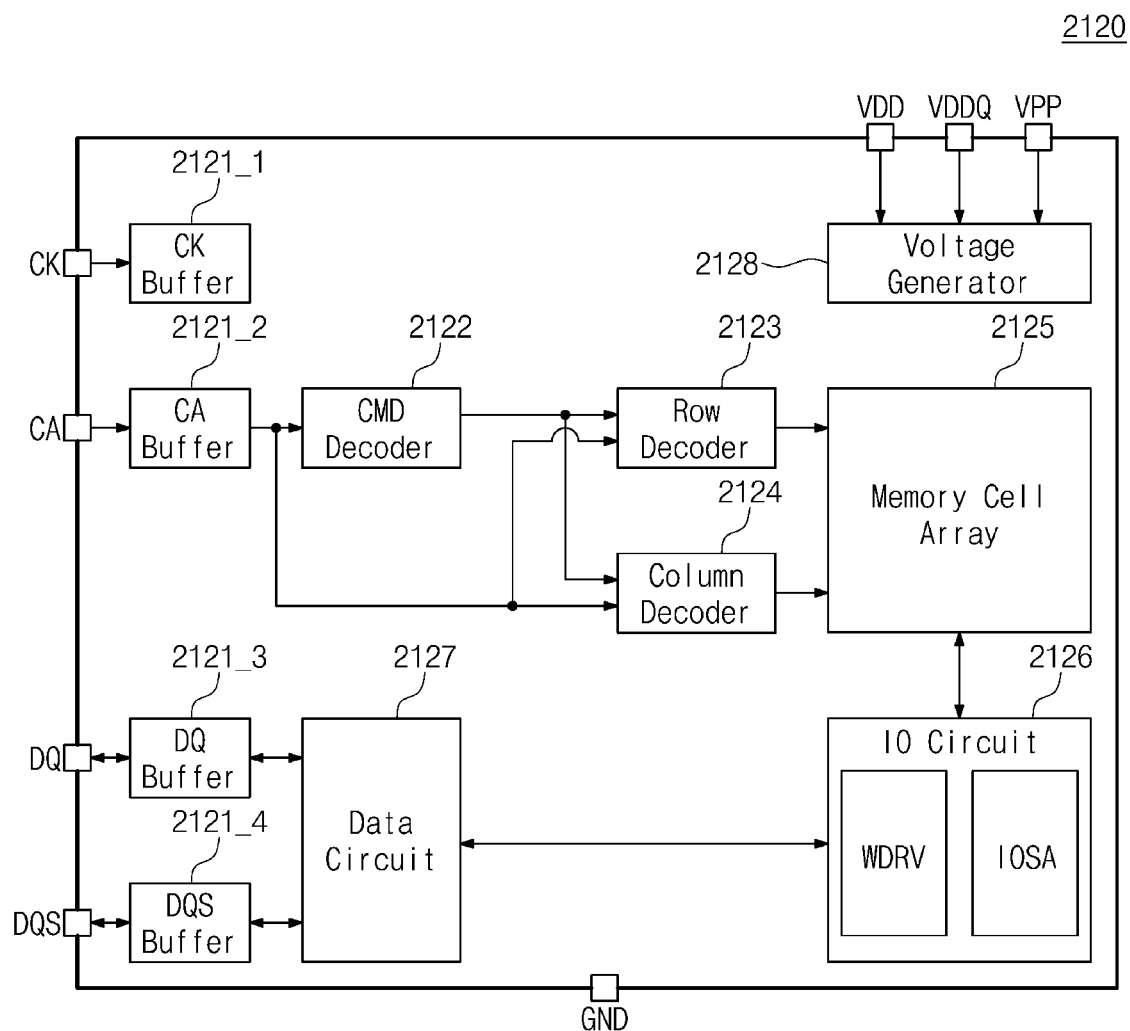
FIG. 12 illustrates a block diagram of a memory device of FIG. 11 according to embodiments of the inventive concept.

FIG. 12 illustrates a block diagram of a memory device of FIG. 11. The memory device 2120 may include a CK buffer 2121_1, a CA buffer 2121_2, a DQ buffer 2121_3, a DQS buffer 2121_4, a command decoder 2122, a row decoder 2123, a column decoder 2124, a memory cell array 2125, an input/output circuit 2126, a data circuit 2127, and a voltage generator 2128. The CK buffer 2121_1 may receive the clock signal CK through the CK pin terminal. The CA buffer 2121_2 may receive the command and address signal CA through the CA pin terminal based on the clock signal CK. The DQ buffer 2121_3 may receive the data input/output signal DQ including write data through the DQ pin terminal or may transmit the data input/output signal DQ including read data through the DQ pin terminal to the outside. The DQS buffer 2121_4 may receive the data strobe signal DQS through the DQS pin terminal or may transmit the data strobe signal DQS through the DQS pin terminal to the outside. The buffers 2121_1 to 2121_4 may operate based on the power supply voltage VDDQ or the power supply voltage VDD.

The command decoder 2122 may decode a command input to the memory device 2120 based on the command and address signal CA. The command decoder 2122 may control the components 2121_1 to 2121_4 and 2123 to 2128 of the memory device 2120 based on a decoding result. The row decoder 2123 may select word lines of the memory cell array 2125 under control of the command decoder 2122. The column decoder 2124 may select column selection lines and bit lines of the memory cell array 2125 under control of the command decoder 2122, and the bit lines may be connected to the column selection lines. The memory cell array 2125 may include memory cells connected to the word lines and the bit lines. The input/output circuit 2126 may include a write driver WDRV and an input/output sense amplifier IOSA. The write driver WDRV may write the write data in memory cells selected by the row decoder 2123 and the column decoder 2124. The input/output sense amplifier IOSA may sense and read the read data from memory cells selected by the row decoder 2123 and the column decoder 2124.

The data circuit 2127 may receive the data input/output signal DQ and the data strobe signal DQS from the DQ buffer 2121_3 and the DQS buffer 2121_4 and may provide the write data to the input/output circuit 2126. The data circuit 2127 may receive the read data from the input/output circuit 2126 and may provide the data input/output signal DQ and the data strobe signal DQS to the DQ buffer 2121_3 and the DQS buffer 2121_4.

The voltage generator 2128 may be supplied with the power supply voltages VDD, VDDQ, and VPP and may supply the power supply voltages VDD, VDDQ, and VPP to internal other components of the memory device 2120. For example, the voltage generator 2128 may supply the power supply voltage VDDQ to the buffers 2121_1 to 2121_4. The voltage generator 2128 may generate a word line selection voltage and a word line non-selection voltage by using the power supply voltage VPP. The voltage generator 2128 may supply the word line selection voltage and the word line non-selection voltage to the row decoder 2123 and the memory cell array 2125.

Figure 13:
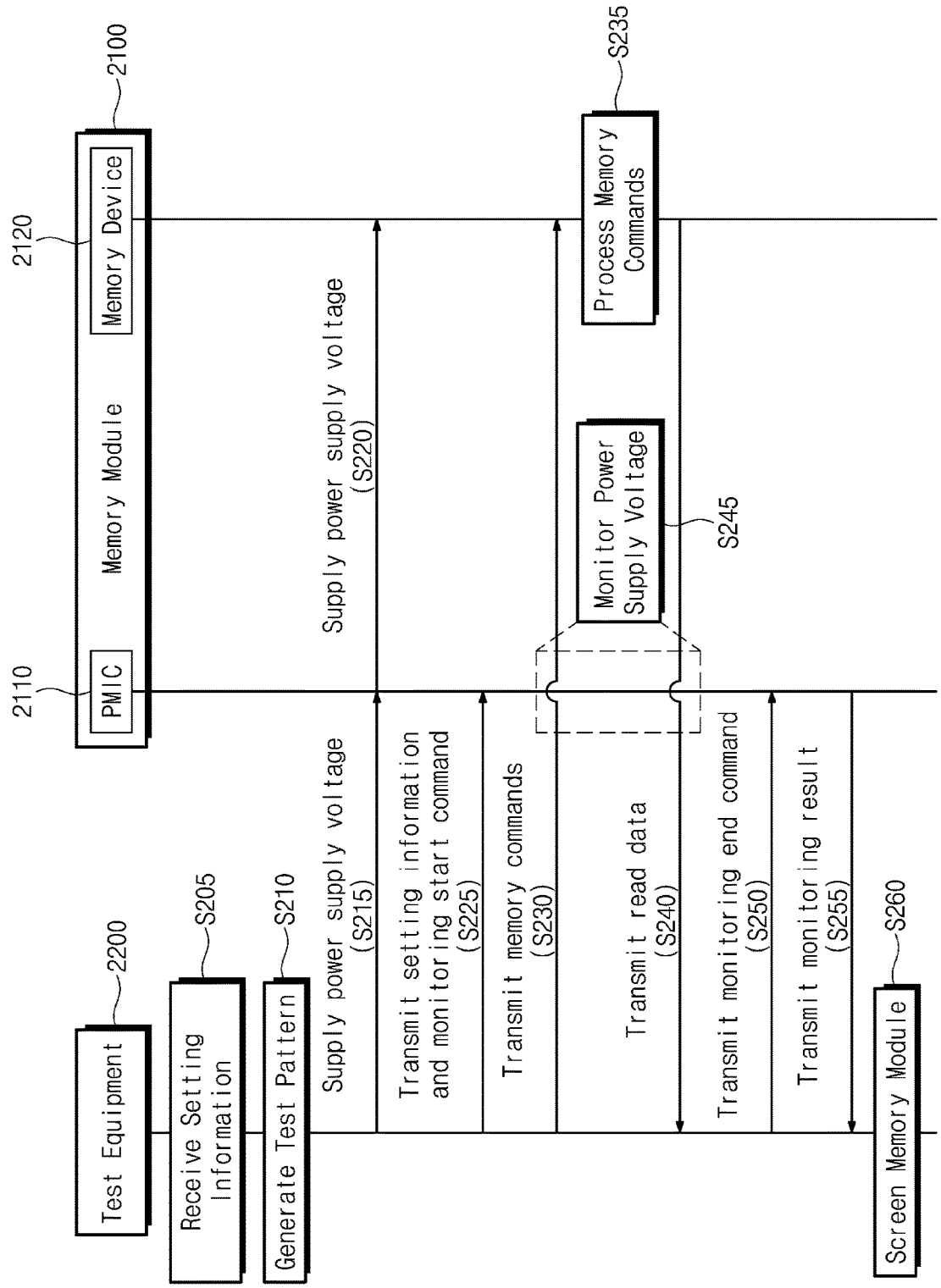
FIG. 13 illustrates a flowchart of an operating method of a test system of FIG. 12 according to embodiments of the inventive concept.

FIG. 13 illustrates a flowchart of an operating method of a test system of FIG. 11. In operation S205, the test equipment 2200 may receive setting information from the user. The setting information may be one of the setting information including the monitoring conditions of the power supply voltage VDD, the setting information including the monitoring conditions of the power supply voltage VDDQ, and the setting information including the monitoring conditions of the power supply voltage VPP.

In operation S210, the test equipment 2200 may generate a test pattern for testing the memory module 2100. The test pattern may be generated depending on various test conditions. For example, the test pattern may include at least one of an active command, a write command, a read command, and a refresh command of the memory device 2120 in the memory module 2100. Based on the test pattern generated in operation S210, the test equipment 2200 may perform operation S215, operation S225, operation S230, operation S240, operation S250, and operation S255. In operation S215, the test equipment 2200 may supply the power supply voltages VIN1, VIN2, and GND to the PMIC 2110. In operation S220, the PMIC 2110 may supply the power supply voltages VDD, VDDQ, and VPP to the memory device 2120.

In operation S225, the test equipment 2200 may transmit the setting information received in operation S205 and the monitoring start command to the PMIC 2110 by using the SCL signal and the SDA signal. Operation S225 may be similar to operation S110 and operation S120. The setting information may be stored in the setting register 242/342 of the PMIC 2110. The test equipment 2200 may transmit the monitoring start command to the PMIC 2110 for requesting the PMIC 2110 to monitor one of the power supply voltages VDD, VDDQ, and VPP of the PMIC 2110. Alternatively, the test equipment 2200 may transmit the monitoring start command to the PMIC 2110 for requesting the PMIC 2110 to monitor all the power supply voltages VDD, VDDQ, and VPP of the PMIC 2110. The test equipment 2200 may change at least one of the triggering bits $T_{TRIGGER}$ of the power supply voltages VDD, VDDQ, and VPP stored in the setting register 242/342 of the PMIC 2110 to the first logical value by using the monitoring start command.

In operation S230, the test equipment 2200 may transmit memory commands to the memory device 2120 through the RCD 2140 by using the clock signal CK and the command and address signal CA. The test equipment 2200 may transmit the data input/output signal DQ including write data and the data strobe signal DQS to the memory device 2120 through the DB 2150. In operation S235, the memory device 2120 may process the memory commands transmitted in operation S230. For example, the memory device 2120 may write the write data in memory cells, may read the read data from memory cells, or may refresh data stored in memory cells. In operation S240, the memory device 2120 may transmit the data input/output signal DQ including the read data and the data strobe signal DQS to the test equipment 2200 through the DB 2150. Operation S240 can be skipped depending on the test pattern generated in operation S210.

In operation S245, the PMIC 2110 may monitor one of the power supply voltages VDD, VDDQ, and VPP in response to the monitoring start command. Alternatively, the PMIC 2110 may monitor all the power supply voltages VDD, VDDQ, and VPP in response to the monitoring start command. In any case, the PMIC 2110 may perform operation S130 to operation S170. While the monitoring operation is performed by the PMIC 2110 (during a monitoring time), the memory device 2120 may process the memory commands received in operation S230 (S235). Also, the memory device 2120 may transmit the read data to the test equipment 2200 (S240).

In operation S250, the test equipment 2200 may transmit the monitoring end command to the PMIC 2110. Operation S250 may be similar to operation S180. In operation S255, the PMIC 2110 may transmit a monitoring result to the test equipment 2200 in response to the monitoring end command. The PMIC 2110 may transmit the ripple count $CNT_H$, the ripple count $CNT_L$, or the violation count $CNT_V$ associated with a power supply voltage(s), the monitoring of which is requested by the monitoring start command in operation S215, from among the power supply voltages VDD, VDDQ, and VPP to the test equipment 2200. In operation S260, based on the monitoring result received in operation S255, the test equipment 2200 may examine the PI of the memory module 2100 and may screen the memory module 2100. For example, when one of ripple counts and violation counts of the power supply voltages VDD, VDDQ, and VPP is greater than a threshold value, the test equipment 2200 may screen the memory module 2100. The threshold value may be determined in advance.

Figure 14:
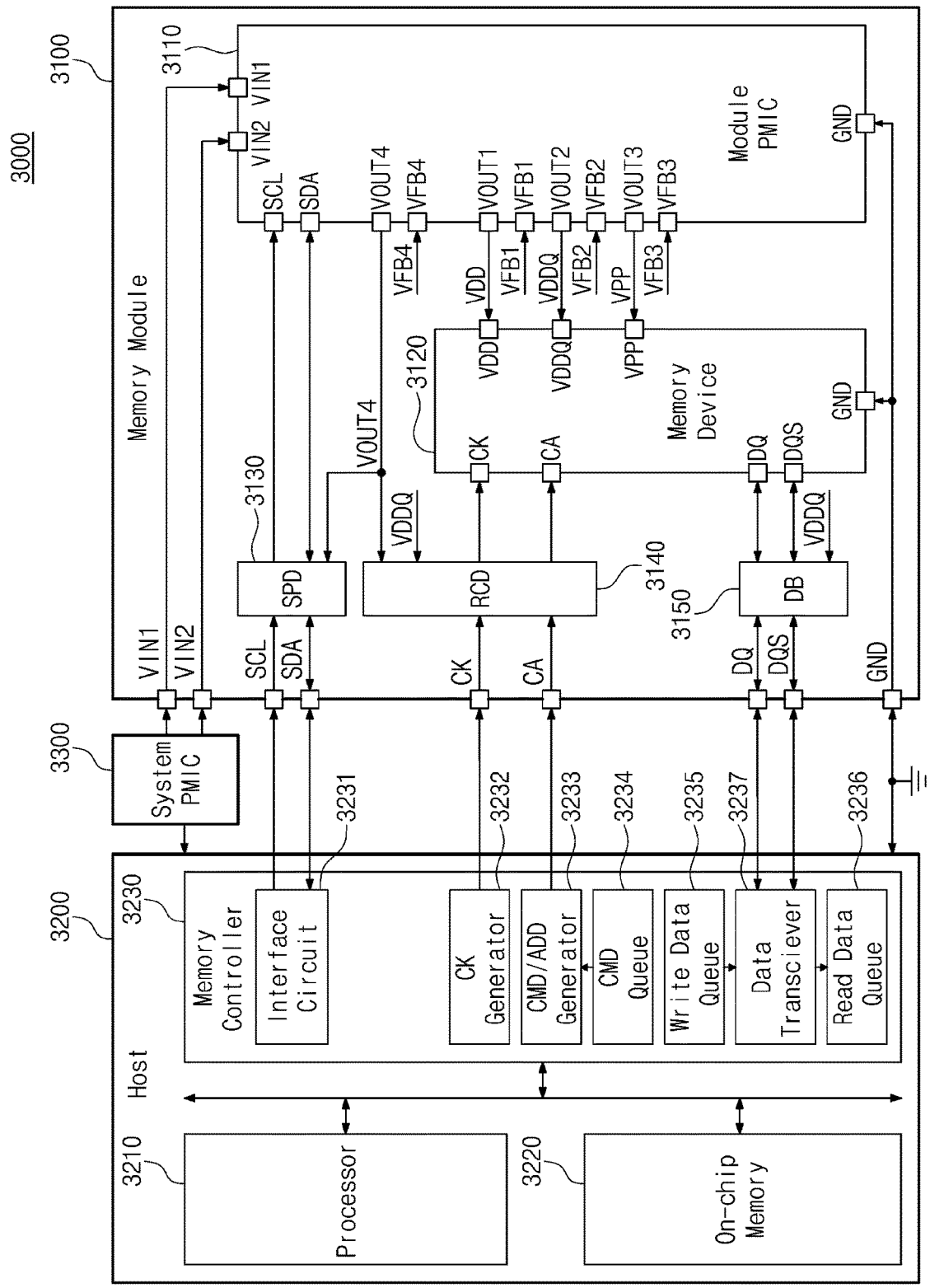
FIG. 14 illustrates a block diagram of a computing system according to another embodiment of the inventive concept.

FIG. 14 illustrates a block diagram of a computing system according to another embodiment of the inventive concept. A computing system 3000 may include a memory module 3100, a host 3200, and a system PMIC 3300. The memory module 3100 may include a PMIC 3110, a memory device 3120, an SPD module 3130, an RCD 3140, and a DB 3150. The memory module 3100 may be substantially the same as the memory module 2100.

The host 3200 may be supplied with power supply voltages from the system PMIC 3300. The host 3200 may include a processor 3210, an on-chip memory 3220, and a memory controller 3230. The host 3200 may be an application processor (AP) or a system-on-chip (SoC).

The processor 3210 may execute various software (e.g., an application program, an operating system, a file system, a device driver, and so on) loaded onto the on-chip memory 3220. The processor 3210 may include homogeneous multi-core processors or heterogeneous multi-core processors. For example, the processor 3210 may include at least one of a central processing unit (CPU), an image signal processing unit (ISP), a digital signal processing unit (DSP), a graphics processing unit (GPU), a vision processing unit (VPU), and a neural processing unit (NPU). An application program, an operating system, a file system, a device driver, or the like for driving the computing system 3000 may be loaded onto the on-chip memory 3220. For example, the on-chip memory 3220 may be an SRAM or a register that is implemented within the host 3200 and has a faster data input/output speed than the memory module 3100. The on-chip memory 3220 may be referred to as a "buffer memory".

The memory controller 3230 may include an interface circuit 3231, a clock generator 3232, a command/address generator 3233, a command queue 3234, a write data queue 3235, a read data queue 3236, and a data transceiver 3237. The interface circuit 3231 may generate the SCL signal and the SDA signal that are based on the I2C protocol or the I3C protocol. The interface circuit 3231 may transmit setting information for the power supply voltages VDD, VDDQ, and VPP, the monitoring start command, and the monitoring end command to the memory module 3100 in response to a request of the processor 3210.

The clock generator 3232 may generate the clock signal CK and may transmit the clock signal CK to the memory module 3100. The command/address generator 3233 may receive a command or an address from the command queue 3234 and may transmit the command or the address to the memory module 3100. The command queue 3234 may store commands and addresses generated by the processor 3210. The write data queue 3235 may receive and store the write data to be stored in the memory module 3100 from the on-chip memory 3220. The read data queue 3236 may store the read data transmitted from the memory module 3100 as a response to a read command of the memory controller 3230. The read data queue 3236 may transmit the read data to the on-chip memory 3220. The data transceiver 3237 may transmit the write data of the write data queue 3235 to the memory module 3100. The data transceiver 3237 may receive the read data from the memory module 3100 and may store the read data in the read data queue 3236.

The system PMIC 3300 may supply a power supply voltage to the host 3200. The system PMIC 3300 may supply the power supply voltages VIN1 and VIN2 to the memory module 3100. The power supply voltages VIN1 and VIN2 supplied from the system PMIC 3300 are not directly provided to the memory module 3100. Instead, the PMIC 3110 may generate the power supply voltages VDD, VDDQ, and VPP by using the power supply voltages VIN1 and VIN2 and may supply the power supply voltages VDD, VDDQ, and VPP to the memory device 3120.

Figure 15:
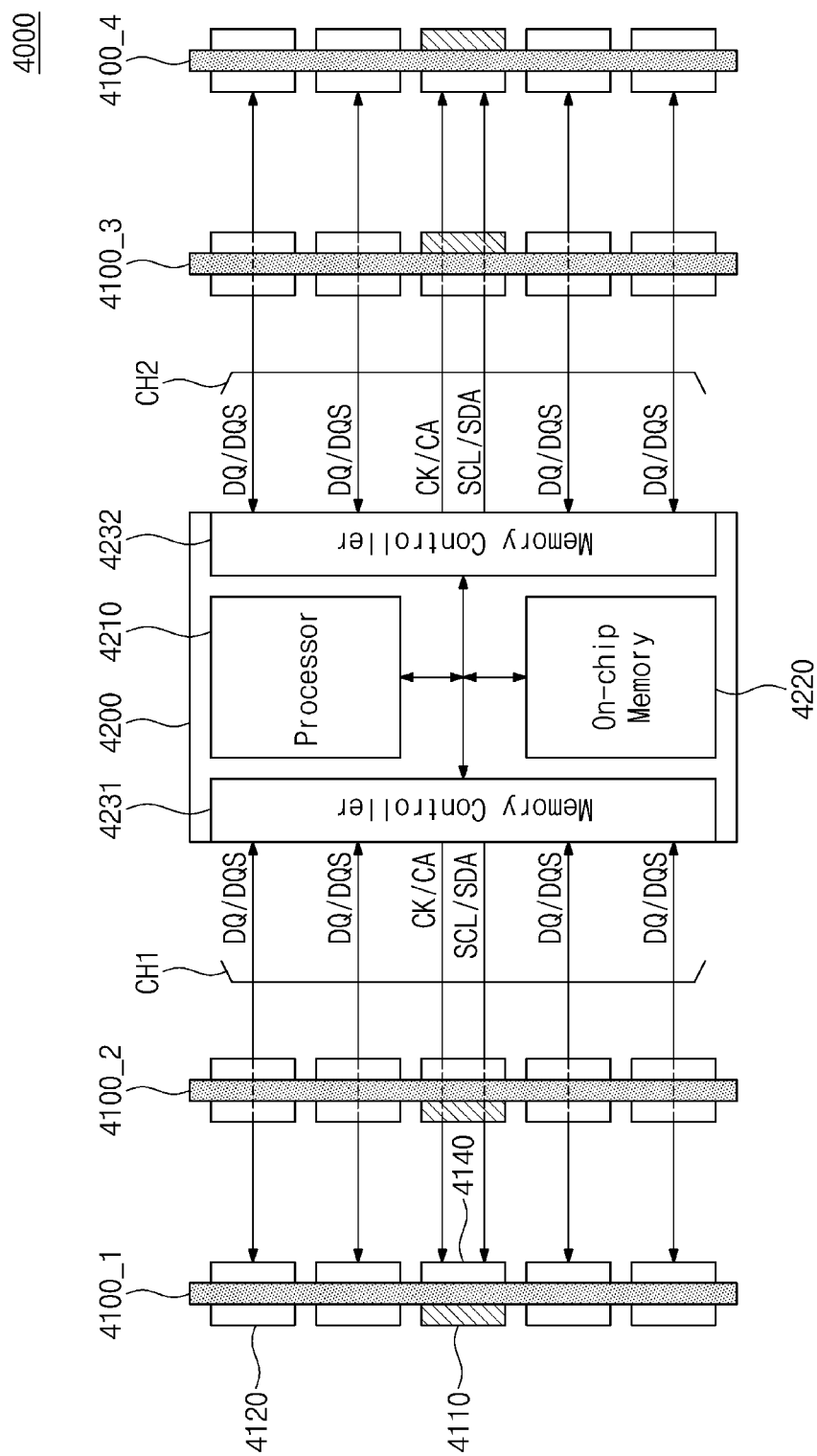
FIG. 15 illustrates a block diagram of a computing system according to another embodiment of the inventive concept.

FIG. 15 illustrates a block diagram of a computing system according to another embodiment of the inventive concept. A computing system 4000 may include memory modules 4100_1 to 4100_4 and a host 4200. The computing system 4000 may further include a system PMIC (3300 of FIG. 14) that supplies the input voltages VIN1 and VIN2 to the memory modules 4100_1 to 4100_4.

The memory module 4100_1 may include a PMIC 4110, a plurality of memory devices 4120, and an RCD 4140. The memory module 4100_1 may further include an SPD module 3130 and a plurality of DBs 3150 of the memory module 3100. The PMIC 4110 may receive the SCL signal and the SDA signal from the host 4200 and may be substantially the same as the PMIC 3110. The PMIC 4110 may supply the power supply voltages VDD, VDDQ, and VPP to the plurality of memory devices 4120. The RCD 4140 may transmit the CK signal and the CA signal transmitted from the host 4200 to the plurality of memory devices 4120 and may be substantially the same as the RCD 3140.

Each of the memory modules 4100_2 and 4100_4 may be substantially the same as the memory module 4100_1. The memory modules 4100_1 and 4100_2 may be allocated to a channel CH1. The memory modules 4100_3 and 4100_4 may be allocated to a channel CH2. The channel CH1 may include input/output paths for the memory modules 4100_1 and 4100_2, and the channel CH2 may include input/output paths for the memory modules 4100_3 and 4100_4. In FIG. 15, the number of channels, the number of memory devices, the number of memory modules, and the number of memory modules allocated to one channel are exemplary. A processor 4210, an on-chip memory 4220, and memory controllers 4231 and 4232 of the processor 4210 may be substantially the same as the processor 3210, the on-chip memory 3220, and the memory controller 3230, respectively. The memory controller 4231 may access the memory modules 4100_1 and 4100_2 through the channel CH1. The memory controller 4232 may access the memory modules 4100_3 and 4100_4 through the channel CH2.

Figure 16:
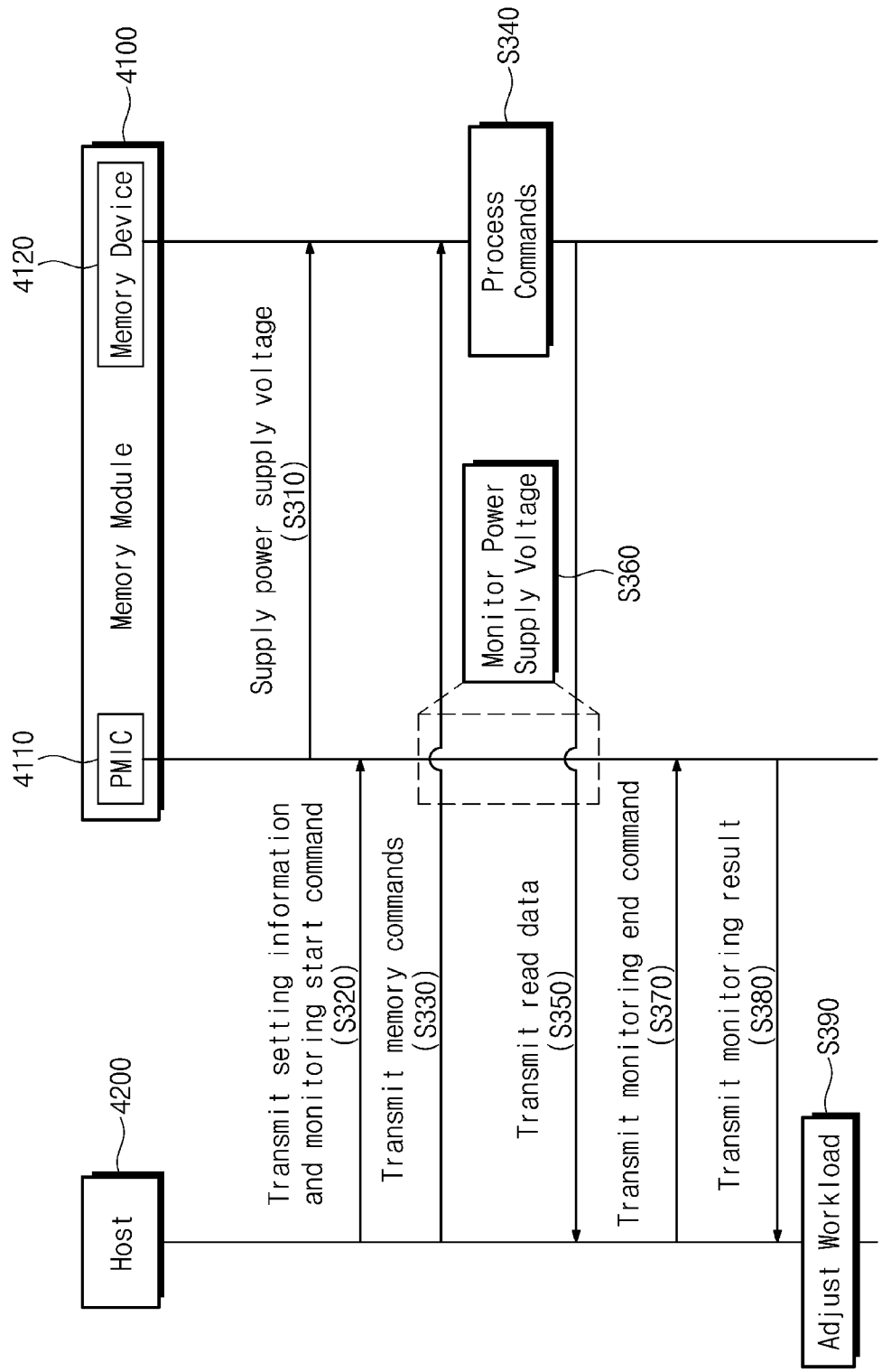
FIG. 16 illustrates a flowchart of an operating method of a computing system according to an embodiment of the inventive concept.

FIG. 16 illustrates a flowchart of an operating method of a computing system according to an embodiment of the inventive concept. In FIG. 16, a memory module 4100 may be one of the memory modules 4100_1 to 4100_4 of FIG. 15.

In operation S310, the PMIC 4110 may supply the power supply voltages VDD, VDDQ, and VPP to the memory devices 4120. In operation S320, the host 4200 may transmit setting information and the monitoring start command to the PMIC 4110 by using the SCL signal and the SDA signal. Operation S320 may be similar to operation S225. The setting information may be one of the setting information including the monitoring conditions of the power supply voltage VDD, the setting information including the monitoring conditions of the power supply voltage VDDQ, and the setting information including the monitoring conditions of the power supply voltage VPP. The setting information may be stored in the setting register 242/342 of the PMIC 4110. The host 4200 may transmit the monitoring start command to the PMIC 4110 for requesting the PMIC 4110 to monitor one of the power supply voltages VDD, VDDQ, and VPP of the PMIC 4110. Alternatively, the host 4200 may transmit the monitoring start command to the PMIC 4110 for requesting the PMIC 4110 to monitor all the power supply voltages VDD, VDDQ, and VPP of the PMIC 4110. The host 4200 may change at least one of the triggering bits $T_{TRIGGER}$ of the power supply voltages VDD, VDDQ, and VPP stored in the setting register 242/342 of the PMIC 4110 to the first logical value by using the monitoring start command.

In operation S330, the host 4200 may transmit memory commands to the memory devices 4120 through the RCD 4140 by using the clock signal CK and the command and address signal CA. In operation S340, the memory devices 4120 may perform a data input/output operation by processing the memory commands transmitted in operation S330. In operation S350, the memory devices 4120 may provide the read data to the host 4200. Operation S330, operation S340, and operation S350 are similar to operation S230, operation S235, and operation S240, respectively. In operation S360, the PMIC 4110 may monitor one of the power supply voltages VDD, VDDQ, and VPP in response to the monitoring start command transmitted in operation S320. Alternatively, the PMIC 4110 may monitor all the power supply voltages VDD, VDDQ, and VPP in response to the monitoring start command transmitted in operation S320. Operation S360 may be similar to operation S245. In any case, the PMIC 4110 may perform operation S130 to operation S170. While the monitoring operation is performed by the PMIC 4110 (during a monitoring time), the memory devices 4120 may process the memory commands received in operation S330 based on the power supply voltages VDD, VDDQ, and VPP (S340). Also, the memory devices 4120 may transmit the read data to the host 4200.

In operation S370, the host 4200 may transmit the monitoring end command to the PMIC 4110. In operation S380, the PMIC 4110 may transmit a monitoring result to the host 4200 in response to the monitoring end command. The PMIC 4110 may transmit the ripple count $CNT_H$, the ripple count $CNT_L$, or the violation count $CNT_V$ associated with a power supply voltage(s), the monitoring of which is(are) requested by the monitoring start command transmitted in operation S320, from among the power supply voltages VDD, VDDQ, and VPP to the host 4200. Operation S370 and operation S380 are similar to operation S250 and operation S255, respectively. In operation S390, based on the monitoring result received in operation S380, the host 4200 may examine the PI of the memory module 2100 and may adjust a workload of the memory module 4100. For example, when one of ripple counts and violation counts of the power supply voltages VDD, VDDQ, and VPP is greater than a threshold value determined in advance, the host 4200 may decrease the workload of the memory module 4100_1 and may instead increase workloads of the other memory modules 4100_2 to 4100_4. The host 4200 may transmit the write data to be stored in the memory module 4100_1 to the other memory modules 4100_2 to 4100_4.

Figure 17:
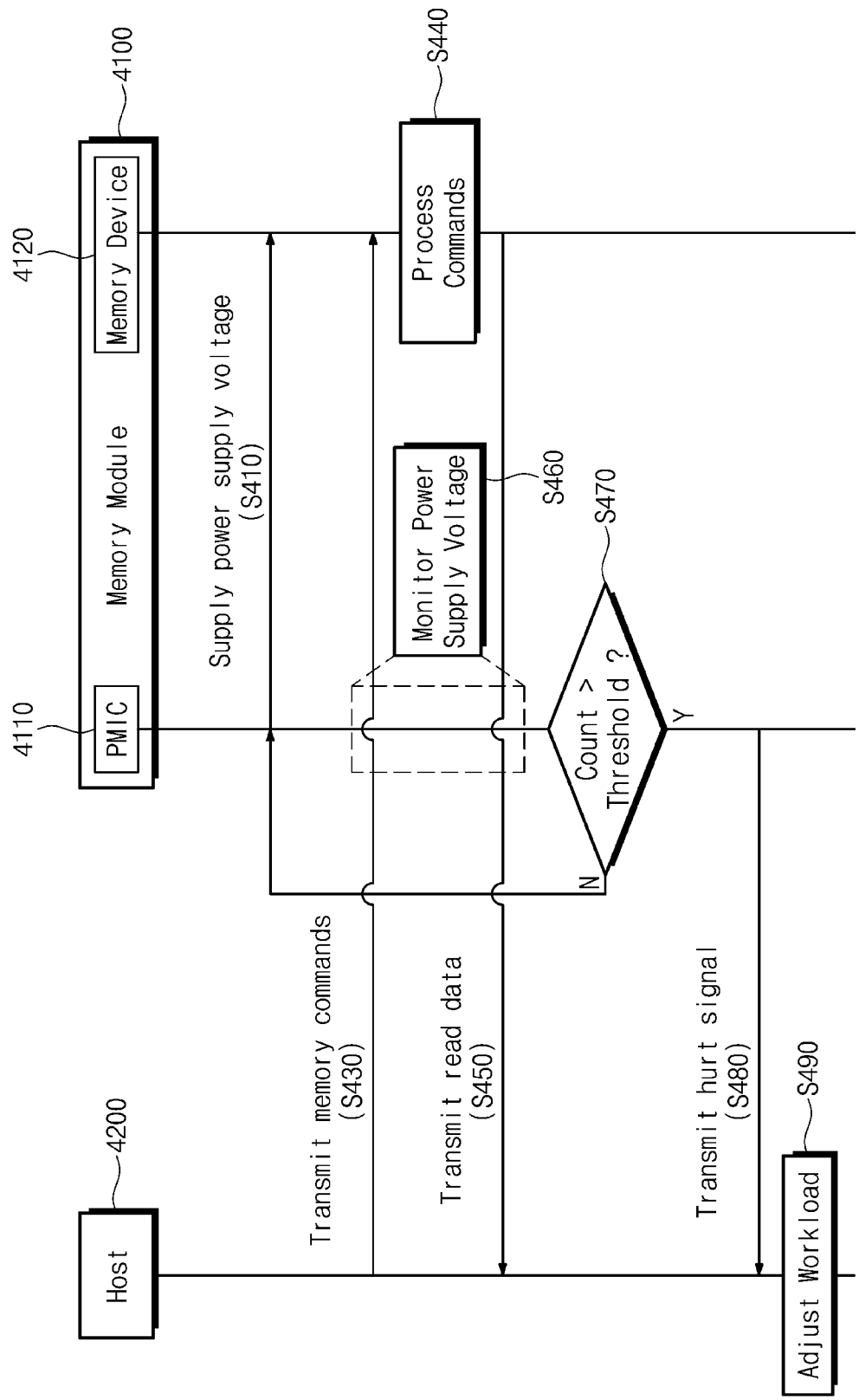
FIG. 17 illustrates a flowchart of an operating method of a computing system of FIG. 15 according to another embodiment of the inventive concept.

FIG. 17 illustrates a flowchart of an operating method of a computing system of FIG. 15 according to another embodiment of the inventive concept. Below, a description will be focused on a difference between the flowchart FIG. 17 and the flowchart of FIG. 16. Operation S410, operation S430, operation S440, operation S450, and operation S490 may be similar to operation S310, operation S330, operation S340, operation S350, and operation S390, respectively.

In operation S460, the PMIC 4110 may monitor one of the power supply voltages VDD, VDDQ, and VPP. Alternatively, the PMIC 4110 may monitor all the power supply voltages VDD, VDDQ, and VPP. For example, the PMIC 4110 may monitor all the power supply voltages VDD, VDDQ, and VPP periodically or randomly without the monitoring start command of operation S320.

In operation S470, the PMIC 4110 may determine whether one of the ripple count $CNT_H$, the ripple count $CNT_L$, or the violation count $CNT_V$ associated with the power supply voltages VDD, VDDQ, and VPP is greater than a threshold value determined in advance. When one of the ripple count $CNT_H$, the ripple count $CNT_L$, or the violation count $CNT_V$ associated with the power supply voltages VDD, VDDQ, and VPP is greater than the threshold value, in operation S480, the PMIC 4110 may transmit a distress signal to the host 4200. For example, the distress signal may be referred to as an "alarm signal" or an "interrupt signal". The threshold value that is used in operation S470 may be stored in the setting register 242/342 of the PMIC 4110 and may be updated by the host 4200. The controller 231/331 of the PMIC 4110 may compare one of the ripple count $CNT_H$, the ripple count $CNT_L$, or the violation count $CNT_V$ associated with the power supply voltages VDD, VDDQ, and VPP with the threshold value. In operation S490, the host 4200 may adjust a workload of the memory module 4100 based on the distress signal received in operation S480.

Figure 18:
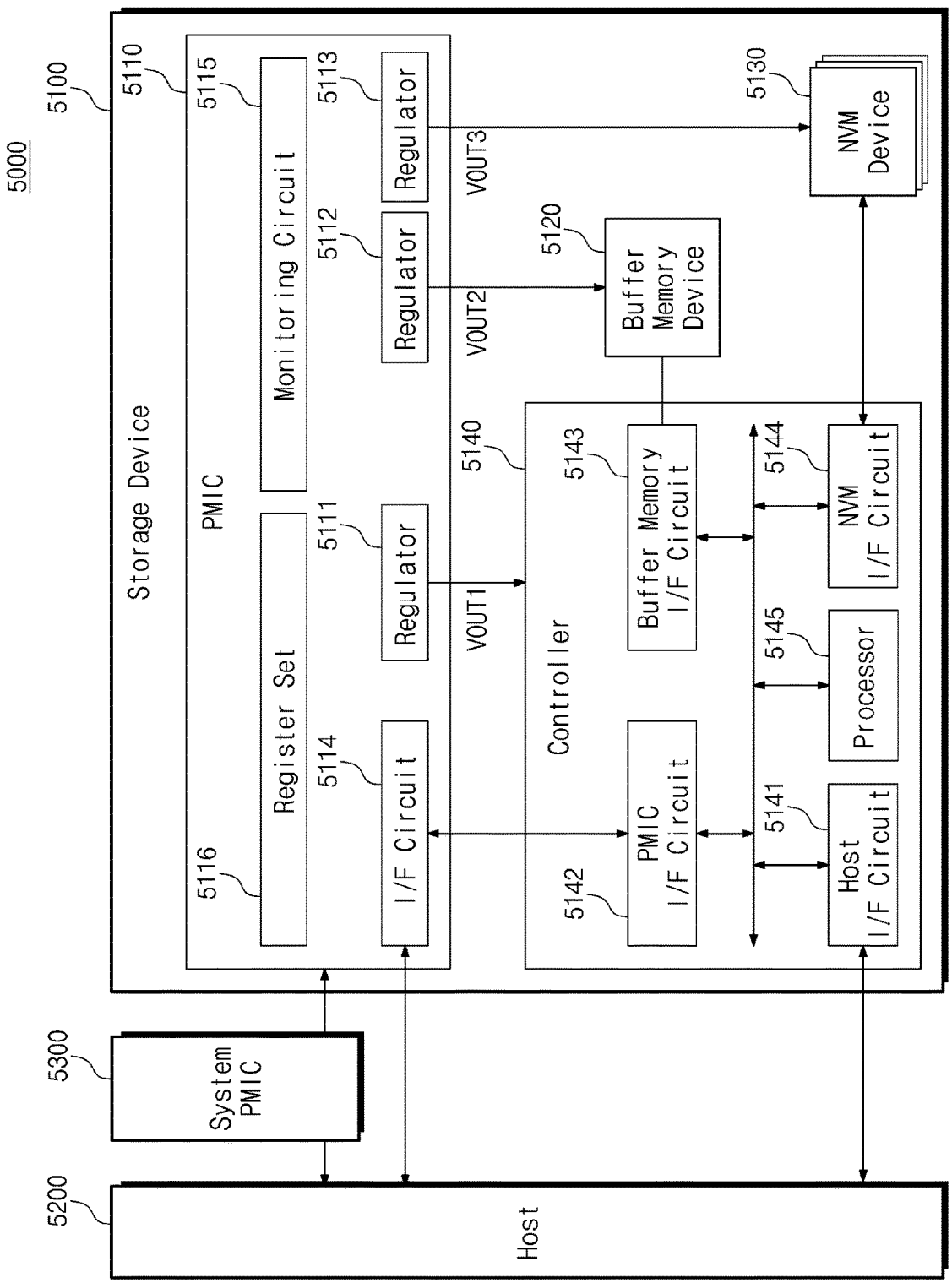
FIG. 18 illustrates a block diagram of a computing system according to another embodiment of the inventive concept.

FIG. 18 illustrates a block diagram of a computing system according to another embodiment of the inventive concept. A computing system S000 may include a storage device S100, a host S200, and a system PMIC S300. The storage device 5100 may be implemented with a solid state drive (SSD), card storage, or embedded storage. The storage device 5100 may include a PMIC 5110, a buffer memory device 5120, nonvolatile memory devices 5130, and a controller 5140.

The PMIC 5110 may be supplied with a power supply voltage from the system PMIC 5300. The PMIC 5110 may include regulators 5111 to 5113, an interface circuit 5114, a monitoring circuit 5115, and a register set 5116. Operations of the PMIC 5110 and the components 5111 to 5116 may be similar to the operations of the PMIC 200 and the components 211, 212, 213, 220, 230, and 240 or the operations of the PMIC 300 and the components 311, 312, 313, 320 330, and 340. The PMIC 5110 may further include the multiplexer 250. The regulators 5111 to 5113 may generate the output voltages VOUT1 to VOUT3 based on a power supply voltage supplied from the system PMIC 5300. The output voltages VOUT1 to VOUT3 may be power supply voltages of the controller 5140, the buffer memory device 5120, and the nonvolatile memory devices 5130.

According to an embodiment, the interface circuit 5114 of the PMIC 5110 may communicate with a PMIC interface circuit 5142 of the controller 5140. As in the PMIC 4110 performing operation S330, operation S360, and operation S380, the PMIC 5110 may receive the setting information for the output voltages VOUT1 to VOUT3, the monitoring start command, and the monitoring end command from the controller 5140, may monitor the output voltages VOUT1 to VOUT3, and may transmit results of monitoring the output voltages VOUT1 to VOUT3 to the controller 5140. As in the PMIC 4110 performing operation S460, operation S470, and operation S480, the PMIC 5110 may monitor the output voltages VOUT1 to VOUT3 and may transmit a distress signal to the controller 5140 based on a monitoring result. According to another embodiment, the interface circuit 5114 of the PMIC 5110 may communicate with the host 5200. As in the PMIC 4110 performing operation S330, operation S360, and operation S380, the PMIC 5110 may receive the setting information for the output voltages VOUT1 to VOUT3, the monitoring start command, and the monitoring end command from the host 5200, may monitor the output voltages VOUT1 to VOUT3, and may transmit results of monitoring the output voltages VOUT1 to VOUT3 to the host 5200. As in the PMIC 4110 performing operation S460, operation S470, and operation S480, the PMIC 5110 may monitor the output voltages VOUT1 to VOUT3 and may transmit a distress signal to the host 5200 based on a monitoring result.

A data input/output speed of the buffer memory device 5120 may be faster than a data input/output speed of the nonvolatile memory devices 5130. The buffer memory device 5120 may store write data to be stored in the nonvolatile memory devices 5130, read data read from the nonvolatile memory devices 5130, metadata associated with an operation of the controller 5140, and so on under control of the controller 5140. For example, the buffer memory device 5120 may include a DRAM device, an SRAM device, or a tightly coupled memory (TCM). The nonvolatile memory devices 5130 may write, read, and erase data under control of the controller 5140. The nonvolatile memory devices 5130 may be, for example, a NAND flash memory device, a NOR flash memory device, a RRAM device, a FRAM device, a PRAM device, an MRAM device, and so on.

The controller 5140 may include a host interface circuit 5141. The host interface circuit 5141 may communicate with the host 5200 based on a protocol such as universal serial bus (USB), small computer system interface (SCSI), advanced technology attachment (ATA), serial AT attachment (SATA), serial attached SCSI (SAS), high speed interchip (HSIC), peripheral component interconnection (PCI), PCI express (PCIe), nonvolatile memory express (NVMe), universal flash storage (UFS), secure digital (SD), multimedia card (MMC), embedded MMC (eMMC), integrated drive electronics (IDE), or enhanced IDE (EIDE).

The controller 5140 may include the PMIC interface circuit 5142. The PMIC interface circuit 5142 may communicate with the PMIC 5110 based on an SPI protocol, an I2C protocol, or an I3C protocol. Unlike the example illustrated in FIG. 18, the interface circuit 5114 may communicate with the host 5200 and may not communicate with the controller 5140. In this case, the controller 5140 may not include the PMIC interface circuit 5142.

The controller 5140 may further include a buffer memory interface circuit 5143 communicating with the buffer memory device 5120, an NVM interface circuit 5144 communicating with the nonvolatile memory devices 5130, and a processor 5145. The buffer memory interface circuit 5143 and the NVM interface circuit 5144 may operate based on a double data rate (DDR) protocol. The processor 5200 may process a request of the host 5200 and may control the components 5141 to 5144 of the controller 5140.

Figure 19:
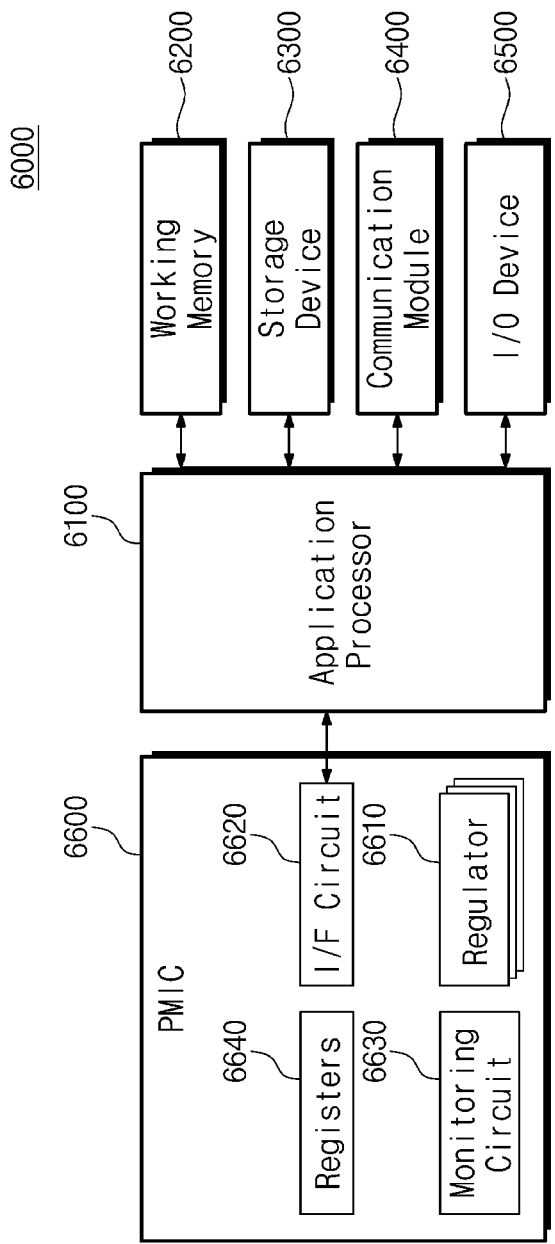
FIG. 19 illustrates a block diagram of a computing system according to another embodiment of the inventive concept.

FIG. 19 illustrates a block diagram of a computing system according to another embodiment of the inventive concept. A computing system 6000 may be implemented with an electronic device capable of using or supporting an interface protocol proposed by the mobile industry processor interface (MIPI) alliance. The computing system 6000 may include an application processor 6100, a working memory 6200, a storage device 6300, a communication module 6400, an input/output device 6500, and a PMIC 6600. The application processor 6100 may control the components 6200 to 6800 of the computing system 6000. An operation of the application processor 6100 may be similar to the operations of the above hosts 3200, 4200, and 5200. The working memory 6200 may temporarily store data processed or to be processed by the application processor 6100. An operation of the working memory 6200 may be similar to the operation of the memory device 2120. The storage device 6300 may semi-permanently store data processed or to be processed by the application processor 6100. An operation of the storage device 6300 may be similar to the operation of the storage device 5100. The communication module 6400 may communicate with an external device based on various communication protocols such as world interoperability for microwave access (Wimax), wireless local area network (WLAN), ultra wideband (UWB), long term evolution (LTE), global system for mobile communications (GSM), code division multiple access (CDMA), Bluetooth, near field communication (NFC), wireless fidelity (Wi-Fi), radio frequency identification (RFID), transfer control protocol/Internet protocol (TCP/IP), USB, SCSI, mobile PCIe (M-PCIe), and Firewire. The input/output device 6500 may include a keyboard, a mouse, a key pad, a button, a touch panel, a touchscreen, a touch pad, a touch ball, a microphone, a gyroscope sensor, a vibration sensor, a liquid crystal display (LCD) device, a light-emitting diode (LED) display device, an organic LED (OLED) display device, an active matrix OLED (AMOLED) display device, a speaker, a motor, an image sensor, a depth sensor, a camera, a display, an antenna, and so on. The PMIC 6600 may include regulators 6610, an interface circuit 6620, a monitoring circuit 6630, and a register set 6640. The regulators 6610 of the PMIC 6600 may supply power supply voltages to the components 6100 to 6500 of the computing system 6000. The PMIC 6600 may operate to be similar to the operations of the PMICs 200, 300, 4110, and 5110. According to an embodiment, as in the PMIC 4110 performing operation S330, operation S360, and operation S380, the PMIC 6600 may receive setting information for power supply voltages output from the regulators 6610, the monitoring start command, and the monitoring end command from the application processor 6100, may monitor the power supply voltages, and may transmit results of monitoring the power supply voltages to the application processor 6100. As in the PMIC 4110 performing operation S460, operation S470, and operation S480, the PMIC 6600 may monitor the power supply voltages may transmit a distress signal to the application processor 6100 based on a monitoring result.

What is claimed is:

1. A power management integrated circuit (PMIC), comprising:
   a voltage regulator configured to generate an output voltage, and to regulate the output voltage using a feedback voltage of the output voltage;
   a monitoring circuit configured to receive the feedback voltage, and to determine at each of periodic intervals whether the feedback voltage is outside a threshold voltage range; and a count register configured to store a count value indicative of a number of times the feedback voltage is determined by the monitoring circuit to be outside the threshold voltage range.

2. The PMIC of claim 1, further comprising an interface (I/F) circuit configured to output monitoring data indicative of the count value stored in the count register to an external device.

3. The PMIC of claim 2, further comprising a setting register, wherein the I/F circuit is further configured to receive operational parameters controlling an operation of the monitoring circuit and to store the operational parameters in the setting register.

4. The PMIC of claim 3, wherein the operational parameters include at least one of the threshold voltage range, a duration of each of the periodic intervals, a monitoring time during which the monitoring circuit is operative, a deviation from a target feedback voltage which defines the threshold voltage range, a monitoring start trigger to start monitoring by the monitoring circuit, and a monitoring stop trigger to stop monitoring by the monitoring circuit.

5. The PMIC of claim 3, further comprising a data pin terminal coupled to the I/F circuit, wherein the operational parameters are received at the data pin terminal.

6. The PMIC of claim 1, wherein the monitoring circuit comprises:
a first comparator configured to compare the feedback voltage with an upper threshold voltage of the threshold voltage range at each of the periodic intervals;
a first counter configured to increment a first count value at each of the periodic intervals in which the first comparator indicates that the feedback voltage is more than the upper threshold voltage;
a second comparator configured to compare the feedback voltage with a lower threshold voltage of the threshold voltage range at each of the periodic intervals; and
a second counter configured to increment a second count value at each of the periodic intervals in which the second comparator indicates that the feedback voltage is less than the lower threshold voltage.

7. The PMIC of claim 6, wherein the count register is configured to store the first count value of the first counter, and the second count value of the second counter.

8. The PMIC of claim 7, wherein the count register is further configured to store a third count value corresponding to a sum of the first and second count values.

9. The PMIC of claim 7, further comprising an interface (I/F) circuit configured to output monitoring data corresponding to at least one of the first and second count values to an external device.

10. The PMIC of claim 1, the voltage regulator comprising:
a voltage generator configured to output a reference voltage;
a comparator configured to compare the reference voltage with the feedback voltage; and
a voltage driver configured to generate the output voltage based on an output of the comparator.

11. The PMIC of claim 10, further comprising a feedback voltage pin terminal connected to the comparator and the monitoring circuit.

12. The PMIC of claim 1, wherein the voltage regulator is a first voltage regulator, the output voltage is a first output voltage, the monitoring circuit is a first monitoring circuit, the count register is a first count register, the count value is a first count value, the threshold voltage range is a first threshold voltage range, and the feedback voltage is a first feedback voltage, and wherein the PMIC further comprises:
a second voltage regulator configured to generate a second output voltage;
a second monitoring circuit configured to receive a second feedback voltage of the second output voltage, and to determine at each of periodic intervals whether the second feedback voltage is outside a second threshold voltage range; and
a second count register configured to store a second count value indicative of a number of times the second feedback voltage is determined by the second monitoring circuit to be outside the second voltage range.

13. The PMIC of claim 1, wherein the voltage regulator is a first voltage regulator, the output voltage is a first output voltage, and the feedback voltage is a first feedback voltage, and wherein the PMIC further comprising:
a second voltage regulator configured to generate a second output voltage; and
a multiplexer circuit configured to selectively apply one of the first feedback voltage and a second feedback voltage of the second output voltage to the monitoring circuit,
wherein the monitoring circuit is configured to store a second count value in the count register indicative of a number of times the second feedback voltage is determined to be outside a second voltage range.

14. The PMIC of claim 1, wherein the feedback voltage is obtained by voltage dividing the output voltage.

15. A dynamic random access memory (DRAM) module, comprising:
a module board;
a DRAM device mounted to the module board, the DRAM device including a plurality of operating voltage terminals; and
a power management integrated circuit (PMIC) mounted to the module board, the PMIC including a plurality of voltage regulators configured to generate a plurality of operating voltages applied to the respective plurality of operating voltage terminals of the DRAM, the PMIC configured to receive a plurality of feedback voltages of the respective plurality of operating voltages, wherein the voltage regulators are further configured to regulate the respective plurality of operating voltages using the feedback voltages,
wherein the PMIC includes a monitoring circuit configured to determine a number of times each of the plurality of feedback voltages is outside a respective threshold voltage range, and to store the number of times in a count register.

16. The DRAM module of claim 15, further comprising:
at least one first pin terminal; and
a serial presence detect (SPD) circuit mounted to the module board and configured exchange PMIC control and data signals between the at least one first pin terminal and the PMIC.

17. The DRAM module of claim 16, further comprising:
at least one second pin terminal; and
a data buffer circuit mounted on the module board and configured to exchange memory data signals between the at least one second terminal and the DRAM device.

18. The DRAM module of claim 17, further comprising:
at least one third pin terminal; and
a register clock driver circuit mounted on the module board and configured to exchange command and address signals between the at least one third pin terminal and the DRAM device.

19. The DRAM module of claim 18, further comprising at least one fourth pin terminal for supplying an input voltage to the PMIC.

* * * * *